United States Patent [19]
Yoneda

[11] Patent Number: 5,642,322

[45] Date of Patent: Jun. 24, 1997

[54] LAYOUT OF SEMICONDUCTOR MEMORY AND CONTENT-ADDRESSABLE MEMORY

[75] Inventor: Masato Yoneda, Chiba, Japan

[73] Assignee: Kawasaki Steel Corporation, Kobe, Japan

[21] Appl. No.: 535,807

[22] Filed: Sep. 28, 1995

[30] Foreign Application Priority Data

May 24, 1995 [JP] Japan ................................ 7-149632

[51] Int. Cl.$^6$ .................. G11C 7/00; G11C 8/00
[52] U.S. Cl. ................. 365/230.03; 365/230.06; 365/230.08; 365/189.05
[58] Field of Search ................. 365/230.03, 230.06, 365/230.08, 189.04, 189.05, 200

[56] References Cited

U.S. PATENT DOCUMENTS 4,389,715  6/1983  Eaton, Jr. et al. .................. 365/200
5,046,046  9/1991  Sweha et al. .................. 365/200

*Primary Examiner*—David C. Nelms
*Assistant Examiner*—Trong Phan
*Attorney, Agent, or Firm*—Oliff & Berridge

[57] ABSTRACT

The layout of a semiconductor memory and a content-addressable memory is adaptable for size reduction, high-speed operation and power saving. The layout of a semiconductor memory on a semiconductor chip has a plurality of memory blocks, each of which includes a plurality of memory wards, a main ward line extending from a main decoder through each memory ward, a memory block selection line extending from a subdecoder through each memory block, and a memory ward selection means provided in each memory ward of each memory block. A column of more than one row of memory cells are used to form each memory ward of each memory block, and at least one subward line for simultaneously and totally activating all the memory cells is provided for the row of memory cells.

13 Claims, 12 Drawing Sheets

LAYOUT OF SEMICONDUCTOR MEMORY AND CONTENT-ADDRESSABLE MEMORY

BACKGROUND OF THE INVENTION

1. Field of the Invention

The present invention relates to the layout of a semiconductor memory and a content-addressable memory, and more particularly to the layout of a semiconductor memory and a content-addressable memory adaptable for size reduction, high-speed operation and power saving.

2. Description of the Prior Art

Existing semiconductor memories are generally characterized by a large storage capacity, memory arrays divided into blocks and hierarchical address decoders. In the case of a content-addressable memory (hereinafter called CAM) on the analogy with the semiconductor memory, the address encoder is also rendered hierarchical. A description will subsequently be given of the conventional layout of a semiconductor memory or CAM, and problems arising therefrom.

FIG. 9 is a block diagram showing the layout of a conventional static random access memory (SRAM). In the layout of this SRAM 100, a memory array 102 comprises a plurality of memory blocks 102a, 102b, ... similar in structure, whereas an address decoder 104 is made hierarchical so as to include a main decoder 106 and a subdecoder 108. In each of the memory blocks 102a, 102b, ... exist a row of memory cells of the same memory ward 116 and a column of memory wards. Moreover, the same main ward signal is supplied from the main decoder 106 via main ward lines 110a, 110b, ... to similar memory wards 116 of all the memory blocks 102a, 102b, ..., whereas different block selection signals (hereinafter called the block signal(s)) are supplied from the subdecoder 108 via memory block selection lines (hereinafter simply called the block line(s)) 112a, 112b, ... to the respective memory blocks 102a, 102b, ... Incidentally, each block in this block diagram is exemplarily shown, using buffers and AND gates.

When an address signal is supplied from the outside to the address decoder 104 in the SRAM 100 thus configured, a high order bit, for example, is decoded by the subdecoder 108, and one of the block signals each applied to the memory blocks 102a, 102b, ... becomes active. Further, a low order bit, for example, is decoded by the main decoder 106, and one of the main ward signals commonly applied to similar memory wards 116 of all the memory blocks 102a, 102b, ... becomes active. In each memory ward 116, the main ward signal and the block signal are ANDed, and the ward signal is supplied via a subward line 128. Thus any desired memory ward 116 is selected by supplying the address signal from outside the SRAM 100.

FIG. 10 is a block circuit diagram of a memory ward of the aforesaid SRAM. This memory ward 116 comprises a plurality of memory cells 41-1, 41-2, ..., 41-n similar in structure. Each of the memory cells 41-1, 42-2, ..., 41-n is provided with a first inverter 20-1 (20-2, ..., 20-n) and a second inverter 21-1 (21-2, ..., 21-n), the output and input of the former being connected to the input and output of the latter, respectively. With these pairs of inverters 20-1, 21-1; 20-2, 21-2; ...; 20-n, 21-n, 1-bit logical data "1" or "0" is stored in each memory cell 41-1 (42-2, ..., 41-n).

In each of the memory cells 41-1, 42-2, ..., 41-n, the output of the first inverter 20-1 (20-2, ..., 20-n) is connected via an N-channel transistor 22-1 (22-2, ..., 22-n) to a bit line 23-1 (23-2, ..., 23-n), and the gates of these transistors 22-1, 22-2, ... 22-n are connected to the subward line 128. Similarly, the output of the second inverter 21-1 (21-2, ..., 21-n) is connected via an N-channel transistor 25-1 (25-2, ..., 25-n) to a bit bar line 26-1 (26-2, ..., 26-n), and the gates of these transistors 25-1, 25-2, ..., 25-n are also connected to the subward line 128.

When, for example, logical data "1" (logical "1" on the output side of the first inverter 20-1, and logical "0" on the output side of the second inverter 21-1) is written to the memory cell 41-1 in the memory ward 116 thus configured, signals of logical "1" and logical "0" are respectively applied to the bit line 23-1 and the bit bar line 26-1 to render the subward line 128 active (logical "1") by supplying from outside the SRAM 100 an address signal for the memory ward 116 to be selected as stated above. Then the signals on the bit line 23-1 and the bit bar line 26-1 are supplied via the respective transistors 22-1, 25-1 and stored in the two inverters 20-1, 21-1.

When, for example, the logical data "0" (logical "0" on the output side of the first inverter 20-2, and logical "1" on the output side of the second inverter 21-2) stored in the memory cell 41-2 as shown in FIG. 10 is read, both the bit line 23-2 and the bit bar line 26-2 are precharged to uniformize their potentials to render the subward line 128 active by supplying from outside the SRAM 100 the address signal for the memory ward 116 to be selected as stated above. Thus a signal of logical "0" stored in the memory cell 41-2 is transmitted via the respective transistors 22-2, 25-2 to the bit line 23-2 and the bit bar line 26-2. Then the bit line 23-2 is discharged and the potential difference between the bit line 23-2 and the bit bar line 26-2 is detected by a sense amplifier (not shown), whereby the data stored in the memory cell 41-2 is read out. The above writing and reading operations are normally performed with one memory ward as a unit.

In the layout of the aforementioned conventional SRAM 100, the same main ward line is commonly input to similar memory wards 116 of all the memory blocks 102a, 102b, ..., that is, the main ward line 110a (110b, ...) is in the form of, for example, metal wiring so that it is passed through a layout area equivalent in height to the layout of one memory ward 116. Therefore, a wiring forming area has been necessitated. By this is meant is that not only a SRAM but also a memory array is formed in blocks, which is common to semiconductor memories having hierarchical address decoders.

A description will subsequently be given of CAM by way of example. Like the SRAM, a Content-Addressable Memory or CAM has a storage unit for storing data, and a retrieval unit for retrieving the data stored in the storage unit. Retrieval data is prestored in the storage unit and when the data stored in the storage unit matches retrieval data, match-data retrieval is carried out in the retrieval unit from which the presence or absence of hit data (coincident data), the stored address and the like are retrieved and output in a single cycle. The CAM is used to improve the performance of a system in which the retrieval process is frequently performed because the use of such a CAM makes it possible to instantly obtain any one of the intended data from an intensive collection of data.

FIG. 11 is a block diagram showing the layout of a conventional CAM. In the layout of this CAM 134, a memory array 136 comprises a plurality of memory blocks 136a, 136b, ... similar in structure, whereas as in the aforesaid SRAM 100, an address decoder (not shown) is made hierarchical so as to include a main decoder and a subdecoder. Further, a priority encoder 138 is made hierarchical so as to include a main priority encoder 140 and a subpriority encoder 142. Incidentally, each block in this block diagram is exemplarily shown, using buffers and AND gates.

In each of the memory blocks 136a, 136b, ... exist a row of memory cells of the same memory ward 152 and a column of memory wards. A hit signal is supplied via a match line 144 to each memory ward 152, and each match line 144 is subjected to wired connection via a tri-state gate 146 to a feed line 148a (148b, ...) in each similar memory ward 152 of all the memory blocks 136a, 136b. Moreover, the hit signal is supplied to the main priority encoder 40 via the feed line 148a (148b, ...) so wired as to straddle across every similar memory ward 152 of all the memory blocks 136a, 136b, ... From the subpriority encoder 142, an enable signal for controlling ON/OFF of the tri-state gate 146 subjected to wired connection to the feed line 148a (148b, ...) is supplied via an enable line 150a (150b, ...) to each of the memory blocks 136a, 136b, ...

When retrieval data is fed from outside the CAM 134 thus configured, the hit signal is generated in the memory ward 152 in which hit data is stored. The hit signal generated in each memory ward 152 and ORed (though not shown) in each of the memory blocks 136a, 136b, ... is supplied to the subpriority encoder 142 from which an active enable signal is supplied via the enable line 150a (150b, ...) to only what is given the highest priority according to the order of priority from among the memory blocks 136a, 136b, ... in which the hit signal has been generated.

In the memory block supplied with the active enable signal, the tri-state gate 146 which subjects the match line 144 and the feed line 148a (148b, ...) to wired connection is turned on, and the hit signal generated in each memory ward 152 is supplied via the feed line 148a (148b, ...) to the main priority encoder 140. Then an address corresponding to what is given the highest priority according to the order of priority from among the memory wards 152 in which the hit signal has been generated is encoded in the main priority encoder 140. By feeding retrieval data from outside the CAM 134, the address of the memory ward where data matching the retrieval data is stored can thus be encoded and output.

FIG. 12 is a block circuit diagram of a (AND type) memory ward of the aforesaid CAM, wherein like reference characters designate like and corresponding elements of the circuit shown in FIG. 10 and only points of difference will be described.

The memory ward 152 shown in FIG. 12 is provided with the following elements in addition to those of the memory ward 116 shown in FIG. 10. In each of the memory cells 11-1, 11-2, ..., 11-n, two N-channel transistors 27-1, 28-1 (27-2, 28-2; ... ; 27-n, 28-n) connected in series are arranged so as to couple the bit line 23-1 (23-2, ..., 23-n) and the bit bar line 26-1 (26-2, ..., 26-n) together. Further, the gate of the transistor 27-1 (27-2, ..., 27-n) is connected to the output of the first inverter 20-1 (20-2, ..., 20-n), whereas the gate of the transistor 28-1 (28-2, ..., 28-n) is connected to the output of the second inverter 21-1 (21-2, ..., 21-n).

Moreover, the memory ward 152 is provided with the match line 144 extending and straddling over the plurality of memory cells 11-1, 11-2, ..., 11-n constituting the memory ward 152. The match line 144 is equipped with N-channel transistors 36-1, 36-2, ..., 36-n each corresponding to the memory cells 11-1, 11-2, ..., 11-n. These transistors 36-1, 36-2, ..., 36-n are connected in series, and the gate of each transistor is connected to the median point between the two transistors 27-1, 28-1 (27-2, 28-2; ... ; 27-n). Further, the right end of the match line 144 shown in FIG. 12 is connected to the drain of a P-channel transistor 32 whose source is connected to a power supply, whereas the left end thereof as shown therein is connected to the drain of an N-channel transistor 36-0 whose source is grounded. Further, a control line 30 is connected to the gates of the transistors 32, 36-0, and the right end of the match line 144 is also input to an inverter 31.

Coincident retrieval, which will be described below, is carried out in the content-addressable memory having the memory ward 152 so configured as shown in FIG. 12 and a peripheral circuit.

First, it is assumed that logical data "1" is stored in the memory cell 11-1, that is, logical "1" is to be retrieved from the memory cell 11-1 in such a state that the output side of the first inverter 20-1 is logical "1", whereas the output side of the second inverter 21-1 is logical "0".

In other words, the subward line 128 is held in the state of logical "0" and the bit line 23-1 is in the state of logical "1" and besides the bit bar line 26-1 is in the state of logical "0". In this case, a voltage of logical "1" is applied to the gate of the transistor 27-1, and a logical "1" signal on the bit line 23-1 is applied to the gate of the transistor 36-1, whereby the transistor 36-1 is turned on; that is, when the data stored in the memory cell 11-1 matches retrieval data supplied via the bit line 23-1 and the bit bar line 26-1, the corresponding transistor 36-1 is turned on.

Subsequently, it is assumed that logical data "0" is stored in the memory cell 11-2, that is, logical "1" is also to be retrieved from the memory cell 11-2 in such a state that the output side of the first inverter 20-2 is logical "0", whereas the output side of the second inverter 21-2 is logical "1".

In other words, the subward line 128 is held in the state of logical "0" and the bit line 23-2 is in the state of logical "1" and besides the bit bar line 26-2 is in the state of logical "0". In this case, a logical "0" signal on the bit bar line 26-2 is applied via the transistor 28-2 to the gate of the transistor 36-2, whereby the transistor 36-2 is held OFF. In the case of inequality, the charge precharged in the match line 144 is not discharged accordingly.

In order to mask a certain memory cell, the logical "0" of the subward line 128 is left unchanged and logical "1" is established on both the bit line 23-n and the bit bar line 26-n as shown in the memory cell 11-n. In this case, either transistor 27-n or 28-n is turned on, depending on which one of the logical data "1" and "0" is stored in the memory cell 11-1, whereby the signal of logical "1" is applied to the gate of the transistor 36-n in either case. The transistor 36-n is then turned on.

At the time of retrieval, the control line 30 is first set to logical "0" and the transistor 32 is turned on, and further the match line 144 on the input side of the inverter 31 is precharged. Then the control line 30 is set to logical "1", and the transistor 32 is turned off and released from the precharged condition, whereas the transistor 36-0 is turned on. When the data stored in the memory ward 152 matches retrieval data over all the memory cells 11-1, 11-2, ..., 11-n constituting the memory ward 152 (the aforesaid mask bit is regarded identical), all the transistors 36-1, 36-2, ..., 36-n are turned on and the charge precharged in the match line 144 is discharged. A hit signal of logical "1" is output from the inverter 31.

In the case of the structure shown in FIG. 12, the match line 144 in each memory ward 152 is simultaneously precharged prior to retrieval, and all the transistors 36-1, 36-2, ..., 36-n are turned on only when the data stored in the memory ward 152 matches retrieval data at the time of retrieval. Then the charge precharged via these transistors 36-1, 36-2, ..., 36-n is discharged and the hit signal is generated, whereby it is considered that match retrieval has been fulfilled.

FIG. 13 is a block circuit diagram of a (OR type) memory ward of the aforesaid CAM, wherein like reference characters designate like and corresponding component elements of the circuit shown in FIG. 10 and only points of difference will be described.

A memory ward 168 of FIG. 13 is provided with the following elements in addition to those of the memory ward 116 shown in FIG. 10. This memory ward 168 is equipped with the match line 144 and an identity retrieval control line 178 extending and straddling over the plurality of memory cells 11-1, 11-2, ..., 11-n constituting the memory ward 168. In each of the memory cells 11-1, 11-2, ..., 11-n, two pairs of N-channel transistors 60-1 and 62-1, 62-1 and 63-1 (60-2 and 61-2, 62-2 and 63-2; ...; 60-n and 61-n, 62-n and 63-n) connected in series are arranged so as to couple the match line 144 and the identity retrieval control line 178 together. Further, the gate of the transistor 60-1 (60-2, ..., 60-n) is connected to the output of the second inverter 20-1 (21-2, ..., 21-n); the gate of the transistor 61-1 (61-2, ..., 61-n) to the output of the bit line 23-1 (23-2, ..., 23-n); the gate of the transistor 62-1 (62-2, ..., 62-n) to the first inverter 20-1 (20-2, ..., 20-n); and the gate of the transistor 63-1 (63-2, ..., 63-n) to the bit bar line 26-1 (26-2, ..., 26-n).

Further, the right end of the match line 144 shown in FIG. 13 is connected to the drain of the P-channel transistor 32 whose source is connected to the power supply, whereas the left end thereof as shown therein is connected to the drain of an N-channel transistor 160 whose source is grounded. Further, a control line 162 is connected to the gates of the transistors 32, 160, and the right end of the match line 144 is also input to the inverter 31.

Match retrieval, which will be described below, is carried out in the content-addressable memory having the memory ward 168 so configured as shown in FIG. 13 and a peripheral circuit.

First, it is assumed that logical data "1" is stored in the memory cell 11-1, that is, logical "1" is to be retrieved from the memory cell 11-1 in such a state that the output side of the first inverter 20-1 is logical "1", whereas the output side of the second inverter 21-1 is logical "0".

In other words, the subward line 128 is held in the state of logical "0" and the bit line 23-1 is in the state of logical "1" and besides the bit bar line 26-1 is in the state of logical "0". In this case, the two pairs of transistors 60-1 and 61-1, 62-1 and 63-1 are kept "ON and OFF" and "OFF and ON", respectively; that is, when the data stored in the memory cell 11-1 matches retrieval data supplied via the bit line 23-1 and the bit bar line 26-1, the two pairs of transistors 60-1 and 61-1, 62-1 and 63-1 connected in series are totally turned off, and the match line 144 and the identity retrieval control line 178 are not electrically connected.

Subsequently, it is assumed that logical data "0" is stored in the memory cell 11-2, that is, logical "1" is also to be retrieved from the memory cell 11-2 in such a state that the output side of the first inverter 20-2 is logical "0", whereas the output side of the second inverter 21-2 is logical "1".

In other words, the subward line 128 is held in the state of logical "0" and the bit line 23-2 is in the state of logical "1" and besides the bit bar line 26-2 is in the state of logical "0". In this case, the two pairs of transistors 60-2 and 61-2, 62-2 and 63-2 connected in series are turned "ON and ON" and turned "OFF and OFF", respectively; that is, one of the two pairs of transistors 60-2 and 61-2, 62-2 and 63-2 connected in series are turned on in the case of inequality, and the match line 144 and the identity retrieval control line 178 are electrically connected.

In order to mask a certain memory cell, the logical "0" of the subward line 128 is left unchanged and logical "1" is established on both the bit line 23-n and the bit bar line 26-n as shown in the memory cell 11-n. In this case, both the two pairs of transistors 60-n and 61-n, 62-n and 63-n connected in series are turned off, irrespective of the data stored in the memory cell 11-n since both the transistors 61-n, 63-n are turned off, and the match line 144 and the identity retrieval control line 178 are not electrically connected.

At the time of retrieval, the control line 162 is first set to logical "0" and the transistor 32 is turned on, and further the match line 144 is precharged. Then the control line 162 is set to logical "1", and the transistor 32 is turned off and released from the precharged condition, whereas the transistor 160 is turned on, so that the identity retrieval control line 178 is electrically connected to the ground. When the data stored in the memory cells 11-1, 11-2, ..., 11-n matches retrieval data over all the memory cells 11-1, 11-2, ..., 11-n constituting the memory ward 168 (the aforesaid mask bit is regarded identical), all the two pairs of transistors 60-1 and 62-1, 63-1 and 63-1; 60-2 and 61-2, 62-2 and 63-2; ...; 60-n and 61-n, 62-n and 63-n connected in series are totally turned off. As the charge precharged in the match line 144 is not discharged, a hit signal of logical "0" is output from the inverter 31.

In the case of the structure shown in FIG. 13, the match line 144 in each memory ward 168 is simultaneously precharged prior to retrieval, and all the two pairs of transistors 60-1 and 62-1, 63-1 and 63-1; 60-2 and 61-2, 62-2 and 63-2; ...; 60-n and 61-n, 62-n and 63-n connected in series are turned off only when the data stored in the memory cells 11-1, 11-2, ..., 11-n of the memory ward 168 matches retrieval data at the time of retrieval. Then the match line 144 is cut off the identity retrieval control line 178 and the charge thus precharged is not discharged, whereby the hit signal is generated. Thus match retrieval is considered to be fulfilled.

In the layout of the aforesaid conventional CAM, the same feed line, like the main ward line in the aforementioned SRAM, is used to wire similar memory wards of all the memory blocks. In other words, the feed line is in the form of metal wiring so that it is passed through an area equivalent in height to the layout of one memory ward. Therefore, a wiring forming area has been necessitated.

SUMMARY OF THE INVENTION

An object of the present invention intended to solve the foregoing problems in the prior art is to provide the layout of a semiconductor memory and a content-addressable memory adaptable for size reduction, high-speed operation and power saving.

In order to accomplish the object above, according to a first embodiment of the present invention, a layout of a semiconductor memory on a semiconductor chip comprises:

a plurality of memory blocks, each block including a plurality of memory wards, each ward including a plurality of memory cells for storing 1-bit data, a main ward line extending from a main decoder for selecting one of the plurality of memory wards through each of the plurality of memory wards of the plurality of memory blocks in a first predetermined direction, a memory block selection line extending from a subdecoder for selecting one of the plurality of memory blocks to the memory wards of each of the plurality of memory blocks in a second direction intersecting the first direction, and at least one memory ward selection means for receiving the main ward line and the memory block selection line in each memory ward of the memory block, and is characterized in that in each memory ward of the memory block, a column of more than one row of the plurality of memory cells are arranged in the first direction and that at least one subward line capable of simultaneously and totally activating the plurality of memory cells constituting the row of memory cells by means of the memory ward selection means is provided for a column of more than one row of memory cells of the same memory ward with respect to the one main ward line.

According to the first embodiment of the present invention, the memory cell is accessed via the subward line extended in the first direction and a pair of bit lines each extending in the second direction and in the two rows of memory cells out of a column of more than one row of memory cells constituting one memory ward, two adjoining pairs of bit lines as one set are preferably arranged so that one of the two bit lines constituting the other pair of bit lines is placed between the two bit lines constituting one pair of bit lines and extended in the second direction. Moreover, the two pairs of bit lines constituting each set are preferably arranged so that the two bit lines constituting one of the two pairs of bit lines constituting each set repeatedly cross each other in different phases in the second direction.

Moreover, one subward line is preferably provided for each row of memory cells of a column of more than one row of memory cells. Moreover, one subward line is commonly used for the plurality of memory cells constituting the two rows of memory cells adjacent to each other in the second direction within a column of more than one row of memory cells, and the plurality of memory cells are arrange on both sides of the subward line for common use. Moreover, the semiconductor memory is preferably a SRAM or a content-addressable memory.

According to a second embodiment of the present invention, a layout of a content-addressable memory on a semiconductor chip comprises:

a plurality of content-addressable memory blocks, each block including a plurality of memory wards, each ward including a plurality of memory cells for storing 1-bit data, a feed line extending from a main priority encoder for encoding flag data obtained as a result of carrying out match retrieval by matching retrieval data supplied to the plurality of memory wards of the content-addressable memory block with stored data as a collection of 1-bit data stored in each of the plurality of content-addressable memory wards according to the predetermined order of priority to the plurality of content-addressable memory blocks in a predetermined first direction with respect to each of the plurality of content-addressable memory wards, a hit block selection line extending from a subpriority encoder for giving priority order to the plurality of content-addressable memory blocks through the whole content-addressable memory wards in a second direction intersecting the first direction with respect to each of the plurality of content-addressable memory blocks, and flag data input means for supplying flag data resulting from the match retrieval in the plurality of content-addressable memory wards via each corresponding feed line to the main priority encoder, the flat data input means being provided in each of the plurality of content-addressable memory wards of the content-addressable memory block selected by the hit block selection line, is characterized in that in each content-addressable memory ward of the content-addressable memory block, a column of more than one row of the plurality of content-addressable memory cells are arranged in the first direction, that the same flag data input means is connectable to more than one row of content-addressable memory cells of the same content-addressable memory ward, and that at least one match line for receiving a hit signal indicative of whether the retrieval data is stored in the content-addressable memory ward at the time of match retrieval is provided for the one feed line.

According a third embodiment of the present invention, the layout of a content-addressable memory which is similar to what is defined according to the second embodiment of the present invention comprises:

a main ward line extending from a main decoder for selecting one of the plurality of content-addressable memory wards through each of the plurality of memory wards of a plurality of content-addressable memory blocks in a first predetermined direction, a memory block selection line extending from a subdecoder for selecting one of the plurality of content-addressable memory blocks to the content-addressable memory wards of each of the plurality of content-addressable memory blocks in a second direction intersecting the first direction, and at least one memory ward selection means for receiving the main ward line and the memory block selection line, the memory ward selection means being provided in each content-addressable memory ward of the content-addressable memory block, is characterized in that at least one subward line capable of simultaneously and totally activating the plurality of content-addressable memory cells constituting the row of memory cells by means of the memory ward selection means is provided for a column of more than one row of content-addressable memory cells of the same content-addressable memory ward with respect to the one main ward line.

According to the second and third embodiments of the present invention, the content-addressable memory cell is accessed via the subward line extended in the first direction and a pair of bit lines each extending in the second direction, and in the two rows of content-addressable memory cells out of a column of more than one row of memory cells constituting one content-addressable memory ward, two adjoining pairs of bit lines as one set are preferably arranged so that one of the two bit lines constituting the other pair of bit lines is placed between the two bit lines constituting one pair of bit lines and extended in the second direction. The two pairs of bit lines constituting each set are preferably arranged so that the two bit lines constituting one of the two pairs of bit lines constituting each set repeatedly cross each other in different phases in the second direction.

Moreover, one match line is commonly used for the plurality of content-addressable memory cells constituting the two rows of content-addressable memory cells adjacent to each other in the second direction within a column of more than one row of content-addressable memory cells, and the plurality of content-addressable memory cells are preferably arrange on both sides of the match line for common use. Moreover, the connection between the retrieval unit of the content-addressable memory cell and the match line is preferably adapted for common used with two content-addressable memory cells arranged on both sides of the match line for common use.

Moreover, one subward line is preferably provided for each row of content-addressable memory cells of a column of more than one row of content-addressable memory cells. Moreover, one subward line is used commonly for the plurality of content-addressable memory cells constituting two vertically adjoining rows of content-addressable memory cells of a column of more than one row of content-addressable memory cells, and the content-addressable memory cells are preferably arranged on both sides of the subward line for common use.

In the layout of the semiconductor memory according to the first embodiment of the present invention, the address decoder is made hierarchical and the plurality of memory cells constituting each memory ward of the memory block in the semiconductor memory, for example, the SRAM are arranged as a column of more than one row of memory cells. In each memory ward, there are hierarchically provided one main ward line common to all or the plurality of memory blocks, more than one subward line for each of two rows of memory cells constituting one memory ward within one memory block or more than one subward line common to more than one adjoining row of memory cells. Therefore, according to the present invention, the length of the main ward line can be reduced to ½ or less in comparison with the conventional layout of a semiconductor memory with hierarchical subward lines, whereby signal transmission speed on the main ward line is increased and the metal wiring space for the main ward line can also be reduced to ½ or less, which contributes increasing memory integration. Moreover, according to the present invention, not only the length of the subward line in the case where the subward line is commonly used for a column of two adjoining rows of memory cells but also the signal transmission length of the subward line in the case where the subward line is provided for each row of memory cells is reduced to ½ or less with the effect of improving the signal transmission speed further. High-speed operation thus becomes possible. This arrangement is also applicable to the memory unit of a content-addressable memory with the same effect that is achievable likewise.

According to the present invention, moreover, two adjoining pairs of bit lines form one set. One of the two bits constituting the other pair of bit lines of the set is placed between the two bits forming one pair of bit lines and extended in the second direction intersecting the first direction. Further, the two pairs of bit lines constituting each set cross each other in the second direction in such a manner that one of two bit lines constituting one pair of bit lines crosses one of two bit lines constituting the other pair of bit lines repeatedly in different phases. With this arrangement, the two bit lines forming the pair of bit lines are equally subjected to the coupling effect in contrast to the prior art. Consequently, the sense amplifier for detecting the voltage difference between the two bit lines is less affected by the coupling effect.

The arrangement like this is also possible for ordinary SRAMs and semiconductor memories such as content-addressable memories without hierarchical ward lines, and the same effect is also achievable.

In the layout of the content-addressable memory (hereinafter simply called CAM), the priority encoder in the content-addressable memory block therein is made hierarchical according to the second and third embodiments of the present invention. As the plurality of content-addressable memory cells constituting each content-addressable memory ward are arranged in the form of a column of more than one row of content-addressable memory cells, there are hierarchically provided one feed line common to all or the plurality of content-addressable memory blocks, one or more of the identity retrieval line (hereinafter simply called the match line) provided for each column of more than one row of content-addressable memory cells constituting one memory ward within one content-addressable memory block or one or more of the match line common to the adjoining rows. According to the present invention, the signal transmission length of the match line can be reduced to ½ in contrast with the layout of a conventional content-addressable memory divided into a plurality of memory blocks. As the length of the feed line can also be reduced to ½, moreover, not only the signal transmission speed of the match line and the feed line but also the match retrieval operation speed is increased. According to the present invention, moreover, it is only needed to provide one feed line for two rows of content-addressable memory cells, whereby the metal wiring space for the feed line in the form of metal wiring can be reduced to ½ or less, which contributes to increasing memory integration.

In the layout of the content-addressable memory according to the present invention, moreover, the length of the match line is approximately halved as the match line is commonly used for a column of the two rows of content-addressable memory cells arranged with the match line held therebetween. Therefore, the retrieval operation speed is increased as the charge precharged is quickly discharged into the match line or the discharged match line is quickly precharged. Further, as the connection between the retrieval units of the content-addressable memory cells on both sides with the common match line held therebetween and the common match line is adapted for common use, the two content-addressable memory cells can commonly be connected at two or one point. The number of electrical connections (contacts, etc.) by means of the connection holes for forming connections is reduced, whereby the retrieval operation speed can be increased, whereas power consumption can also be reduced. This arrangement is effectively applicable to any ordinary content-addressable memory in which memory blocks are not formed, and feed and match lines are not made hierarchical.

The layout of the content-addressable memory according to the third embodiment of the present invention has features in addition to those stated above in that the ward lines in the memory unit of the content-addressable memory are set hierarchical as in the first embodiment of the present invention or the pairs of bit lines are made to cross each other with the effect of attaining high integration and increasing the operating speed further in addition to the effect stated above.

Although the ward line is normally formed with a polysilicon layer, wiring resistance in such a polysilicon layer is high, which results in decreasing the operating speed. For this reason, it has heretofore been practiced to line the polysilicon layer with a metal layer, increase an layout area and impose severe conditions on the layout itself. According to the present invention, however, the address decoder is made hierarchical by providing a semiconductor memory or a content-addressable memory in the form of memory blocks. The plurality of memory cells constituting one memory ward are divided into more than one row and arranged in parallel, irrespective of whether or not the ward line is made hierarchical to include a main ward line and a subward line, whether or not the priority encoder is made hierarchical by dividing the memory into blocks to include feed and match lines or whether or not the match line is adapted for common use in the content-addressable memory. Consequently, the ward or the subward line is to be divided into two even when the ward or the subward line is not adapted for common use. However, the length of the ward or the subward line is approximately halved, which contributes to increasing the operating speed.

According to the present invention further, the ward or the subward line is divided into two, whereby each of the two ward lines can independently be activated. Therefore, it also becomes possible to provide access independently to only even- or odd-numbered bits of the memory ward, for example.

DESCRIPTION OF THE PREFERRED EMBODIMENTS

Referring to the accompanying drawings, a detailed description will subsequently be given of the preferred embodiments of the present invention in the form of a semiconductor memory and a content-addressable memory.

Figure 1:
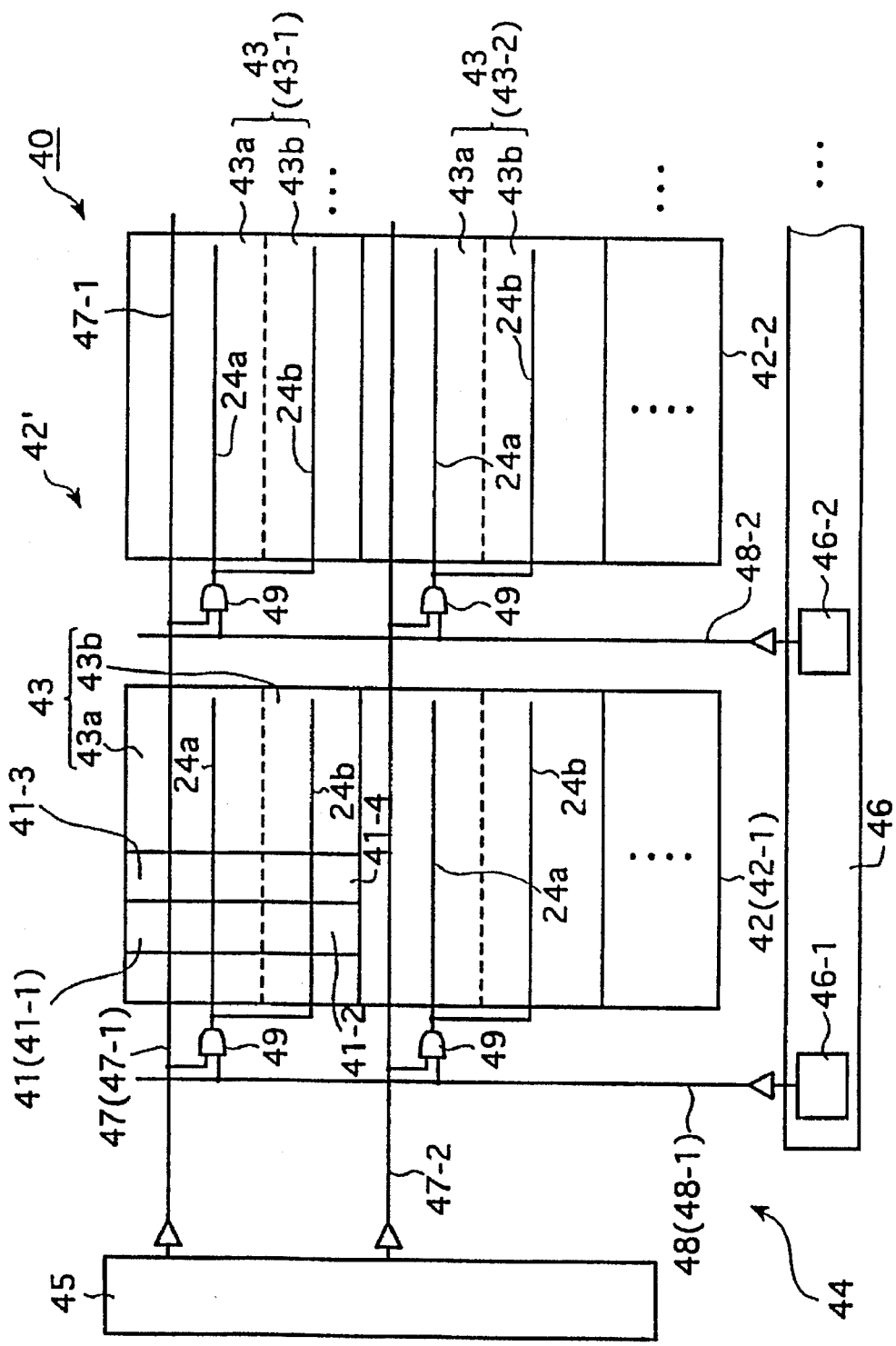
FIG. 1 is a block diagram of the layout of a semiconductor memory embodying the present invention.

FIG. 1 is a block diagram showing the layout of a semiconductor memory employed for the layout of a SRAM according to a first embodiment of the present invention.

As shown in FIG. 1, a SRAM 40 has a memory array 42' and an address decoder 44. The memory array 42' comprises a plurality of memory blocks 41-1, 42-2, ... similar in structure, whereas the address decoder 44 is made hierarchical so as to include a main decoder 45 and a subdecoder 46 (46-1, 46-2, ... ). In each of the memory blocks 42-1, 42-2, ... exist two rows 43a, 43b of memory cells (vertically arranged as shown in FIG. 1) as one set, each row including a predetermined number of memory cells (bits) 41 (horizontally arranged as shown therein), and a column of a predetermined number of sets (wards). In this case, the memory cell 41 is used for storing 1-bit data.

The present invention is primarily featured in that a memory ward 43 including the memory cells 41 having bits (e.g., 4, 8, 16 bits etc.,) equivalent to one ward is formed with the two rows 43a, 43b of memory cells as one set, each including the memory cells 41 for storing bits equivalent to ½ ward and that only one main ward line 47-1 (47-2, ... ) is appropriated for the two rows of memory cells as one set. Therefore, the number of memory ward lines 47-1, 47-2, ... necessary for rows of memory cells can be halved, whereby the formation of a highly integrated memory cell becomes feasible.

Needless to say, it is possible to arrange one main ward line for N (N≧2) rows of memory cells.

Similar main ward lines 47-1, 47-2, ... are respectively extended horizontally through similar memory wards 43-1, 43-2, ... of all the memory blocks 42-1, 42-2, ... so that the same main ward signal is applied from the main decoder 45 thereto. On the other hand, memory block selection lines (hereinafter simply called the block line(s)) 48-1, 48-2, ... are vertically extended so that different block selection signals (hereinafter simply called the block signal(s)) are supplied from the subdecoders 46-1, 46-2, ... to all the memory wards 43-1, 43-2, ... of the respective memory blocks 42-1, 42-2, ...

The rows 43a, 43b of memory cells constituting the memory ward 43 of each memory block 42 are each provided with 2-input AND circuits 49 with the main ward line 47 and the block line 48 as inputs, and the output of the AND circuit 49 is connected to subward lines 24a, 24b each provided for the rows 43a, 43b of memory cells. In other words, one memory ward 43 is provided with one main ward line 47 and the two subward lines 24a, 24b which are activated simultaneously with the main ward line, whereby all the memory cells 41 on the rows 43a, 43b of memory cells can simultaneously be activated.

The two subward lines 24a, 24b need not necessarily be activated simultaneously; in this case, however, an additional block selection signal will be required from the subdecoder 46.

The bit line structure of the memory cell 41 differs depending on whether or not the two subward lines 24a, 24b are simultaneously made active.

A detailed description will consecutively be given of a method for gaining access to the memory cell 41 in the case where the two subward lines are simultaneously activated.

In FIG. 1, there are representatively shown the memory cells 41-1, 41-3 constituting the row 43a of memory cells, and the memory cells 41-2, 41-4 constituting the row 43b thereof in the memory ward 43-1 of the memory block 42-1. I/O controllers each including read/write sense amplifiers and bit line drivers with respect to the memory cell 41 are provided above the memory cells 41-1, 41-3 as shown in FIG. 1, the I/O controllers being connected by a bit line.

When an address signal is supplied from the outside to the address decoder 44 in the SRAM 40 thus configured, a high order bit, for example, is decoded by the subdecoder 46, and one of the block signals each applied to the memory blocks 42-1, 42-2, . . . becomes active. Further, a low order bit, for example, is decoded by the main decoder 45, and one of the main ward lines 47-1, 47-2, . . . commonly input to similar memory wards 43 of all the memory blocks 42-1, 42-2, . . . becomes active. In each memory ward 43, the main ward signal and the block signal are ANDed, and the ward signal is supplied via the subward lines 24a, 24b. Accordingly, only the outputs of the AND circuits 49 connected to the main ward line 47 and the block line 48 that have been rendered active become active, and only the subward lines 24a, 24b connected to the AND circuits 49 become active. Thus one of the memory wards 43 of the desired memory block 42 is selected by applying the address signal from outside the SRAM 40.

Figure 2:
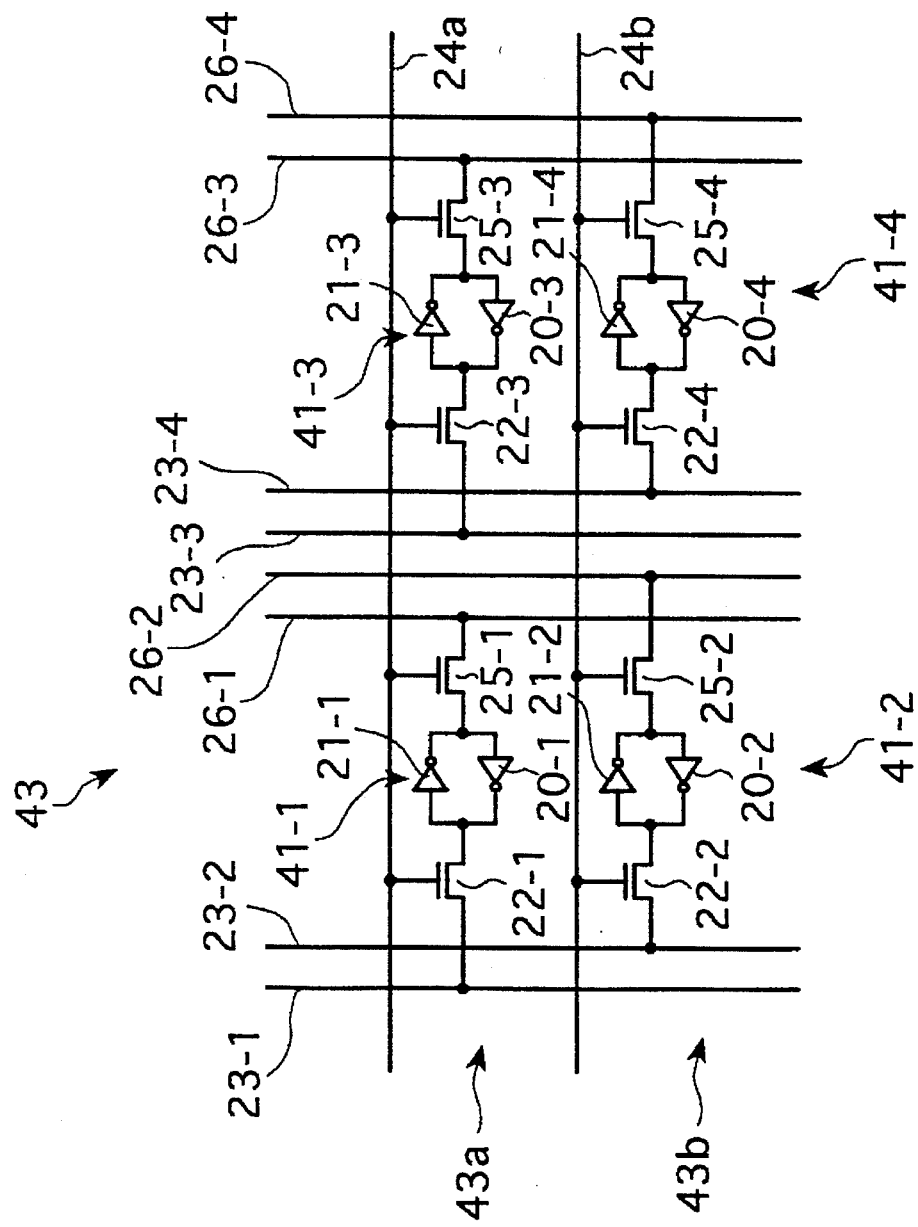
FIG. 2 is a block circuit diagram showing an arrangement of SRAM cells of a memory ward employed for memory layout according to the present invention.

Subsequently, FIG. 2 shows an embodiment of rows of memory cells constituting a memory ward of the invention. FIG. 2 is a block circuit diagram showing the aforementioned four SRAM memory cells 41-1, 41-2, 41-3, 41-4 as a typical example of the two rows of memory cells 43a, 43b as one set. The memory ward 43 shown in FIG. 2 is exactly similar to the memory ward 116 shown in FIG. 10 excluding an arrangement of subward lines and memory cells. Since the memory cells 41 are thus arranged likewise, like reference characters are given to like component elements with the omission of the detailed description of them, and only points of difference will mainly be described.

As shown in FIG. 2, there are vertically arranged two upper and lower rows of memory cells 41-1, 41-2, 41-3, 41-4. A description will subsequently be given of two memory cells 41-1, 41-2 vertically arranged as shown in FIG. 2 by way of example. A bit line 23-1 and a bit bar line 26-1 form a pair of bit lines. In addition, one bit line 23-2 out of two bit lines 23-2, 26-2 forming another pair of bit lines is disposed between the two bit lines 23-1, 26-1 forming the preceding pair of bit lines. In this manner, the bit lines (including the bit bar lines) 23-1, 23-2, . . . ; 26-1, 26-2, . . . form two pairs of bit lines adjacent to each other as one set. Moreover, one of the two bit lines forming the other pair of bit lines is placed between the two bit lines forming one pair of bit lines partly forming each set, the bit line thus held therebetween extending vertically as shown in FIG. 2.

The reason for the upper and lower memory cells to have different bit lines each is that the subward lines 24a, 24b of these memory cells are simultaneously activated. Although area efficiency looks low at first as the number of bit lines is doubled, actual area efficiency is substantially improved because the area occupied by transistors constituting a memory cell is considerably great, whereas the number of sets of bit lines is normally set moderate, which means there is still a space to spare so that the additional set of bit lines above may be provided by making use of the space left over.

Needless to say, one set of bit lines for common use is sufficient in a case where these subward lines 24a, 24b are not activated simultaneously.

In a short range shown in FIG. 2, each pair of bit lines are linearly and vertically extended. However, the bit lines are preferably so arranged as to cross each other repeatedly in a vertical long range of FIG. 2. The detailed description of such crossing will be given later.

Figure 9:
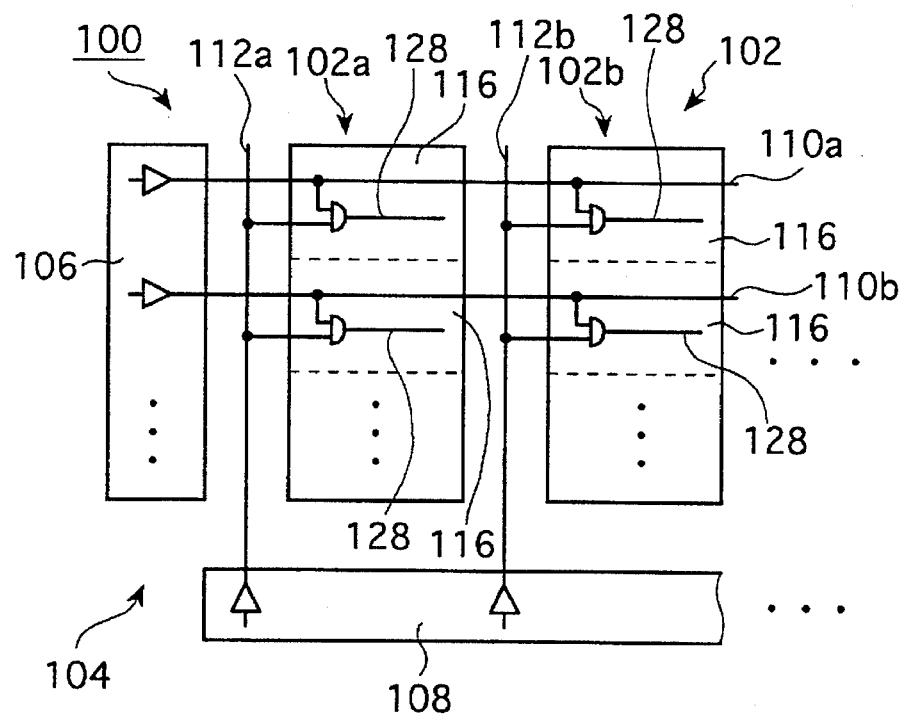
FIG. 9 is a block diagram showing the conventional layout of a semiconductor memory.
Figure 11:
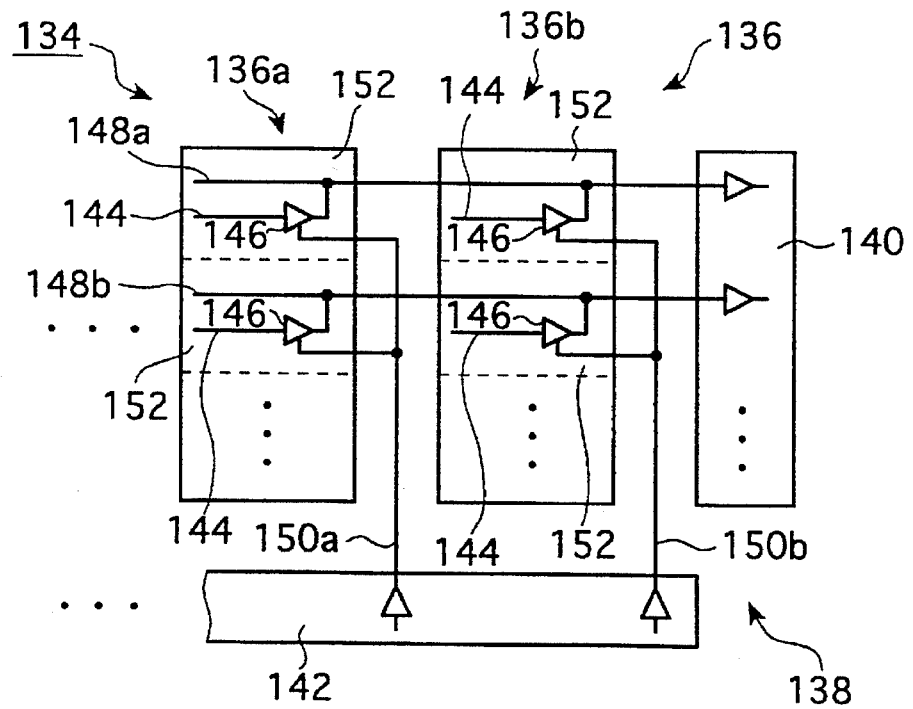
FIG. 11 is a block diagram showing the conventional layout of a content-addressable memory.
Figure 10:
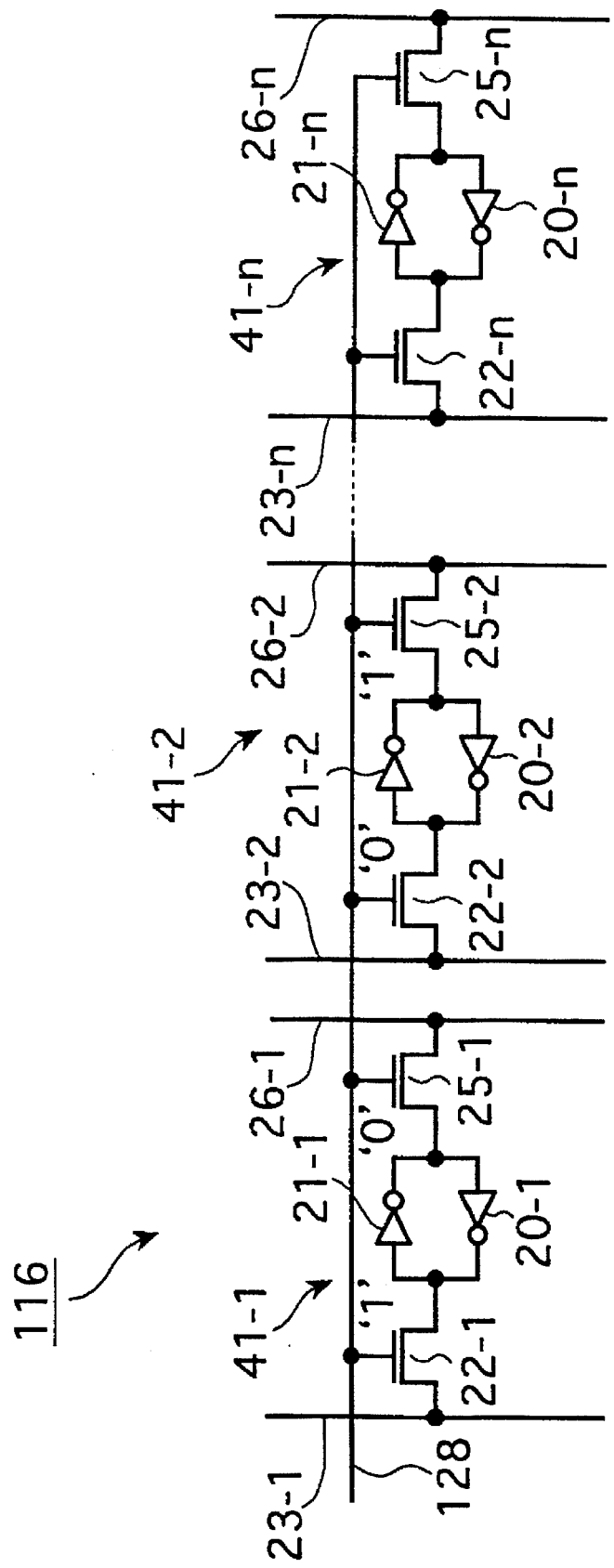
FIG. 10 is a block circuit diagram showing an arrangement of SRAM cells of a conventional memory ward.
Figure 12:
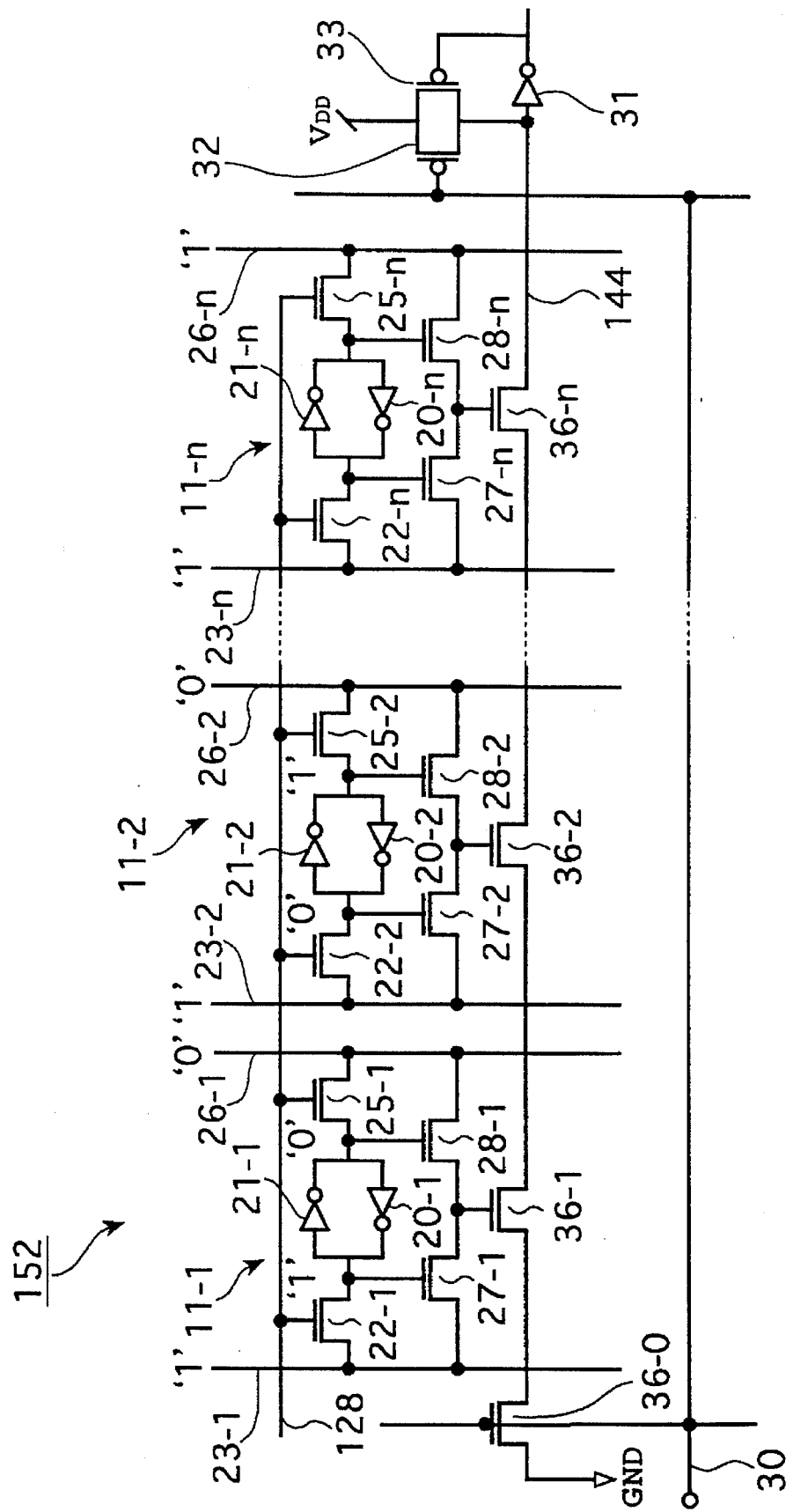
FIG. 12 is a block circuit diagram showing an arrangement of CAM cells of a conventional memory ward.

In the case of the arrangement of memory cells of the memory ward 43 shown in FIGS. 1 and 2, the subward line 128 of FIG. 9 is divided into two subward lines 24a, 24b of FIG. 1, in contrast with the arrangement of memory cells of the memory ward 116 shown in FIGS. 9 and 10. Although the whole length of the subward lines in both cases are the same, the length of each of the subward lines 24a, 24b is halved. In other words, the transmission speed of a signal to be transmitted through the subward lines 24a, 24b usually formed with polysilicon layers exhibiting high wiring resistance is improved and the circuit operating speed is increased accordingly.

Figure 3:
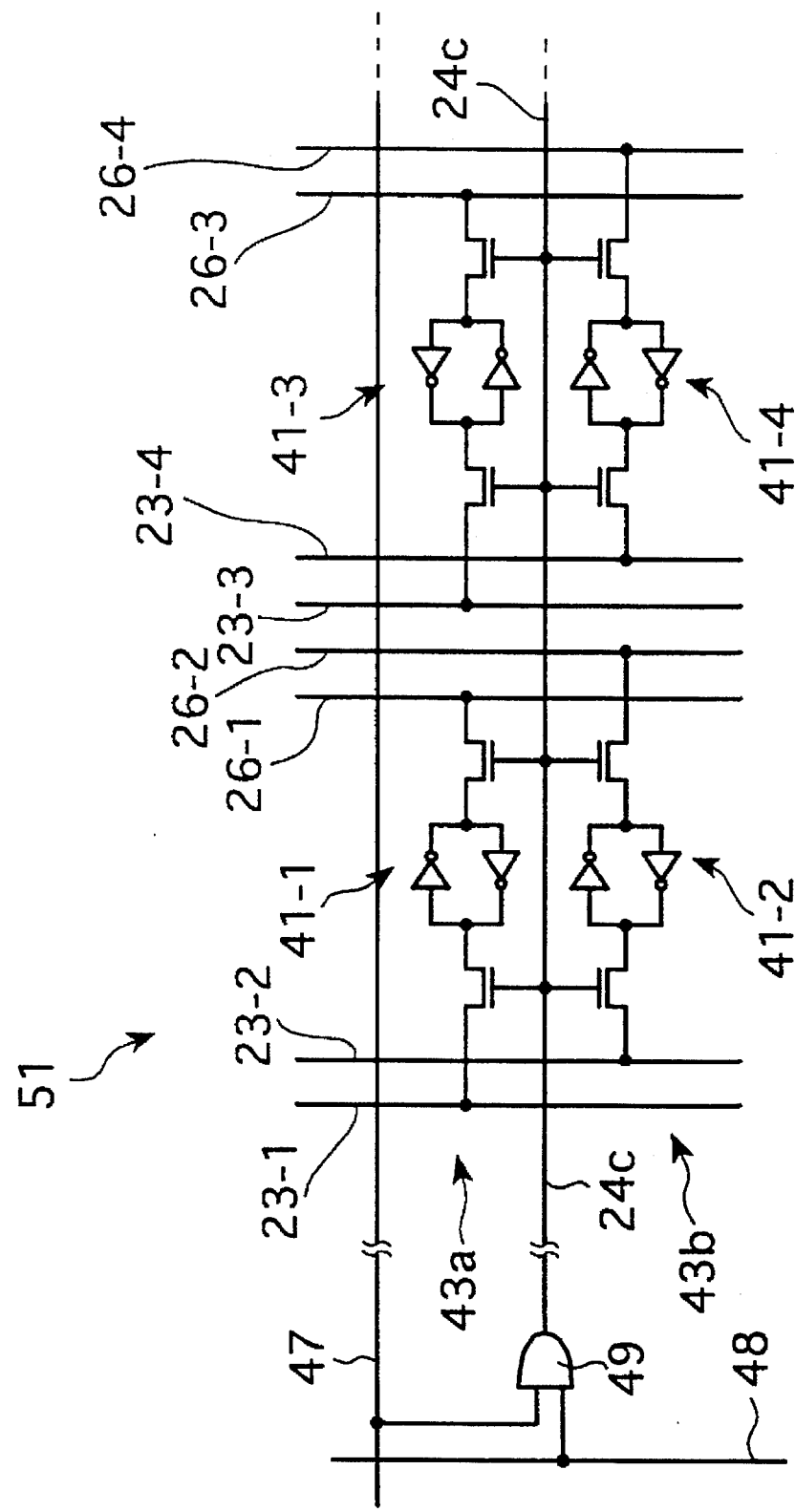
FIG. 3 is a block circuit diagram showing another arrangement of SRAM cells of a memory ward employed for memory layout according to the present invention.

FIG. 3 is a block circuit diagram showing another arrangement of memory cells of a memory ward that can be employed for memory layout according to the present invention. The rows 43a, 43b of memory cells of FIG. 3 are arranged so that the memory cells in the upper row 43a are inverted. As a subward line 24c extending horizontally as shown in the center of FIG. 3 is commonly used for the rows 43a, 43b of memory cells, the two rows of memory cells 41-1, 41-2, 41-3, 41-4, . . . are arranged with the subward line 24c held therebetween.

In the case of the arrangement of memory cells shown in FIG. 3, only one subward line 24c for common use is employed in contrast with that of memory cells shown in FIG. 10 to ensure that area efficiency or the circuit operating speed is improved to that extent.

In the layout of the SRAM thus configured according to the present invention, memory cells can be arranged in not less than two rows instead of one row in the prior art, irrespective of the memory configuration shown in FIG. 2 or 3. Accordingly, not only the number of main ward lines 47 shown in FIG. 1 but also the length of each of the subward lines 24a, 24b, 24c can be reduced to ½ or less. Therefore, the metal wiring space of the main ward lines 47 in each memory ward can also be reduced to ½ or less and this makes increased memory integration possible.

Figure 4:
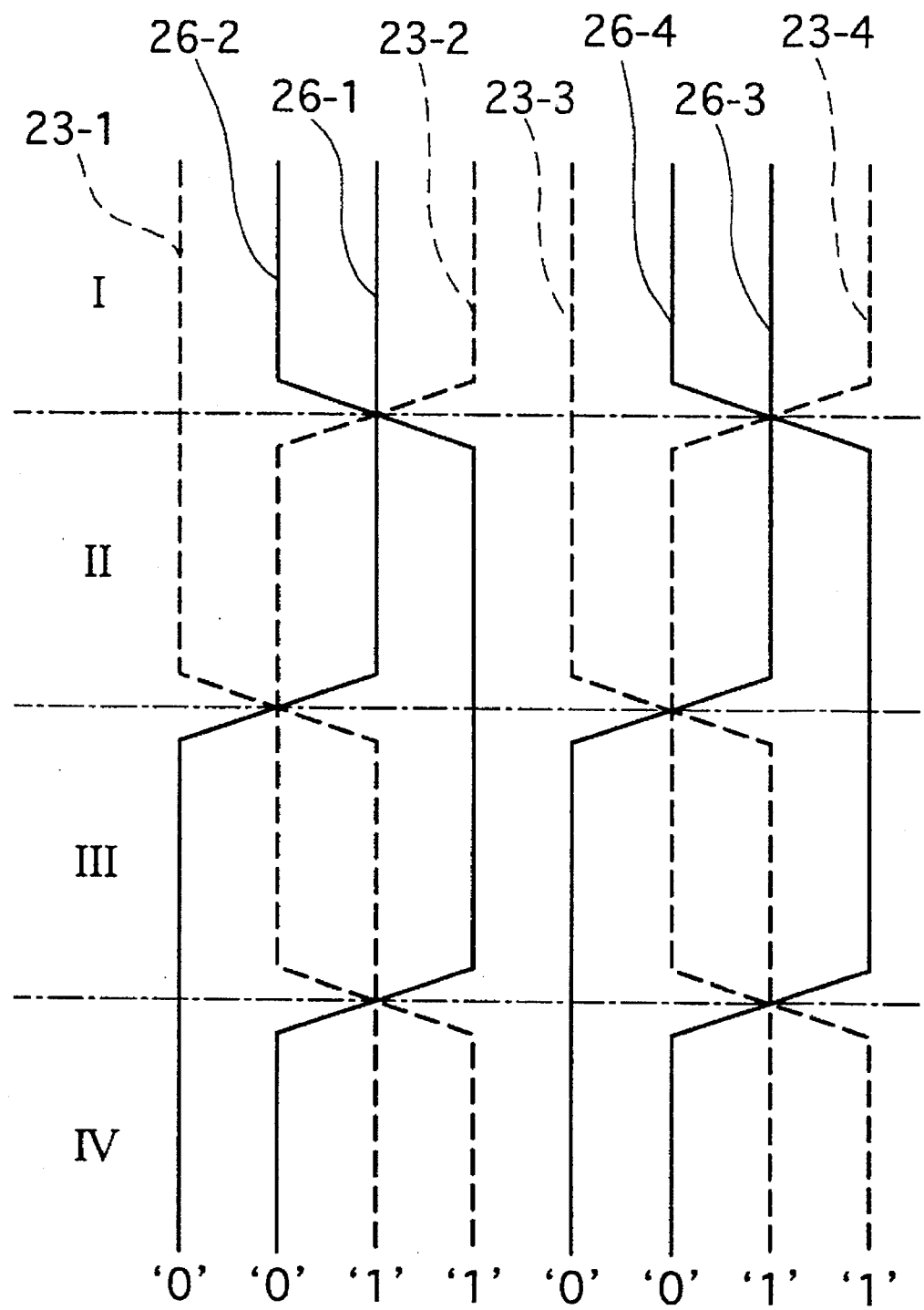
FIG. 4 is a wiring diagram showing an arrangement of bit lines employed for memory layout according to the present invention.

FIG. 4 is a wiring diagram showing a preferred arrangement of bit lines employed for memory layout according to the present invention.

With respect to these bit lines 23-1, . . . , 23-4, . . . ; 26-1, . . . , 26-4, . . . , two pairs of bit lines adjacent to each other form one set as stated above, and one of two bit lines forming the other pair of bit lines is placed between the two bit lines forming one pair of bit lines partly forming each set, the bit line thus held therebetween extending vertically as shown in FIG. 4. As shown in FIG. 4, further, the two pairs of bit lines constituting each set are such that the two bit lines constituting each pair of bit lines repeatedly cross each other in phases different from each other in the vertical direction of FIG. 4.

This arrangement of bit lines 23-1, 26-1; 23-2, 26-2 will be described.

The bit line 23-1 and the bit line 26-1 form one pair of bit lines, and the bit line 23-2 and the bit line 26-2 form another pair of bit lines. These two pairs of bit lines form one set. The two bit lines 23-1, 26-1 constituting one pair of bit lines also constituting one set repeatedly cross each other. Moreover, the two bit lines 23-2, 26-2 constituting the other pair of bit lines also constituting that set repeatedly cross each other. However, the crossing of the bit lines 23-1, 26-1 and that of the bit lines 23-2, 26-2 are different in phase in the vertical direction of FIG. 4.

A description will subsequently be given of the influence of coupling of bit lines when the bit lines 23-1, . . . , 23-4, . . . ; 26-1, . . . , 26-4 are used for wiring as shown in FIG. 4 with special attention directed to, for example, the bit lines 23-2, 26-2.

The bit line 26-2 used to form a pair with the bit line 23-2 is considered first. The reason for this is that the sense operation of the SRAM memory is generally to detect whether the memory is "0" or "1" from the voltage difference between two bit lines forming a pair and on condition that both the bit lines are equally affected by another bit line, it is equally true that they remain entirely unaffected thereby.

Bit lines close to and likely to affect one pair of bit lines 23-2, 26-2 in sections I–II of FIG. 4 are three bit lines 23-1, 26-1, 23-3. With respect to the bit line 23-1, however, the same influence of the coupling directed to the bit line 26-2 in the section I is directed to the bit line 23-2 of the pair in the section II. With respect to the bit line 23-2 likewise, the influence of the coupling directed to the bit line 23-2 in the section I is directed to the bit line 26-2 of the pair in the section II. With respect to the bit line 26-1, moreover, it is situated in between the pair of bit lines 23-2, 26-2 and is exerting the entirely same influence on the pair of bit lines 23-2, 26-2. This also applies to the remaining section.

More specifically, the arrangement above allows the adjoining bit lines to affect each other to the exactly same extent, whereby the sense operation of the SRAM memory can be prevented from being improperly performed.

In the examples given above, one main ward line 47 is so laid out as to pass through all the memory blocks 42 as shown in FIG. 1. However, the present invention is not limited to that arrangement but may be implemented so that one main ward line is made to pass through a plurality of memory blocks. For example, memory blocks are divided into groups, and a plurality of memory blocks are used to constitute each group. Then one main ward line is made to pass through the plurality of memory blocks in each group.

Figure 5:
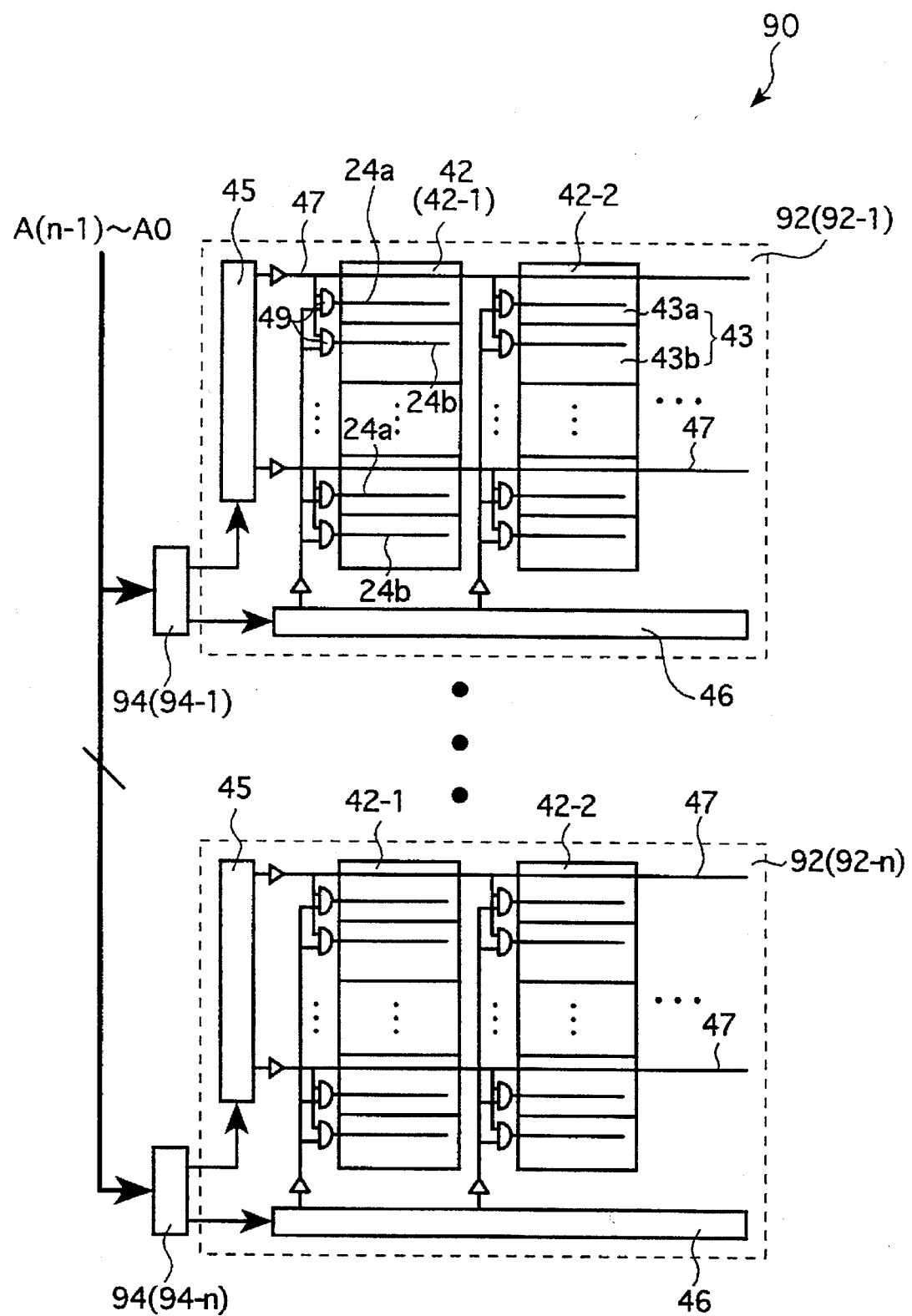
FIG. 5 is a block diagram showing the layout of another semiconductor memory embodying the present invention.

As shown in FIG. 5, for example, a SRAM 90 comprises n pieces of memory block groups 92 (92-1, ..., 92-n), each including a plurality of memory blocks 42 (42-1, 42-2, ...) as those constituting one memory block 42. Each memory block group 92 is organized in a manner similar to the SRAM 40 of FIG. 1. In this case, the main decoder 45 and the subdecoder 46 within each memory block group 92 are connected to a memory block group selection circuit 94 (94-1, ..., 94-n) in each memory block group 92, each of the memory block group selection circuits 94 (94-1, ..., 94-n) being connected to a group selection line 96. By selecting an address A (n−1)–AO, one memory block group 92 is selected via the group selection line 96.

In the SRAM 90 thus configured as shown in FIG. 5, the plurality of memory blocks 42 (42-1, 42-2, ...) are formed into one memory block group 92, which is selected by the group selection circuit 94 via the group selection line 96 and controlled by the main ward lines 47 within the memory block group 92.

A description will subsequently be given of the layout of content-addressable memories according to a second and a third embodiment of the present invention.

Figure 6:
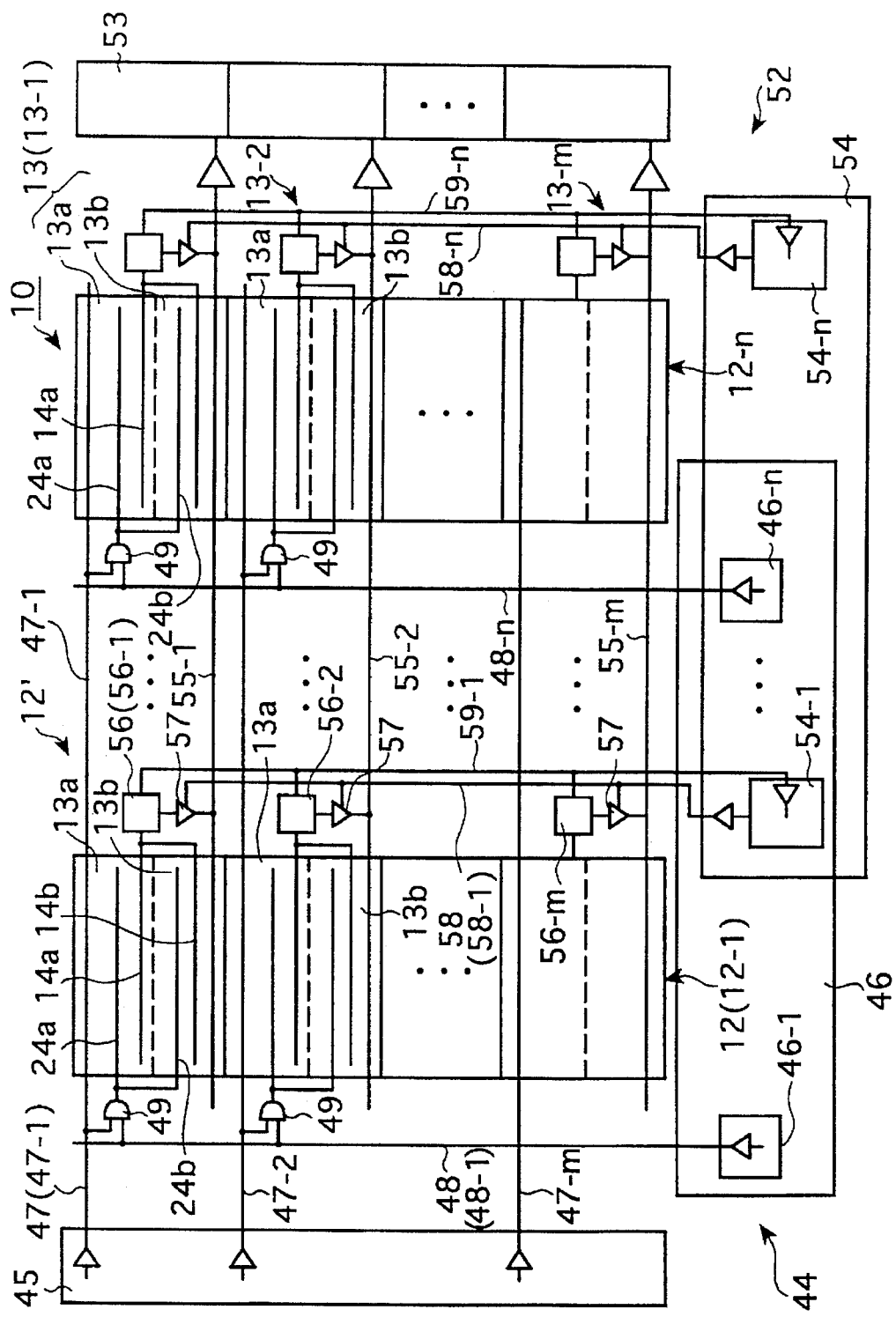
FIG. 6 is a block diagram showing the layout of a content-addressable memory embodying the present invention.

FIG. 6 is a block diagram showing the layout of a content-addressable memory (hereinafter simply called CAM) embodying the present invention.

As shown in FIG. 6, a CAM 10 has a content-addressable memory array 12', an address decoder 44 and a priority encoder 52. The memory array 12' comprises a plurality of memory blocks 12-1, ..., 12-n similar in structure, whereas as in the SRAM of FIG. 1, the address decoder 44 is made hierarchical so as to include a main decoder 45 and a subdecoder 46. Further, the priority encoder 52 is also made hierarchical so as to include a main priority encoder 53 (hereinafter simply called the main encoder) and a subpriority encoder (hereinafter simply called the subencoder) 54 (54-1, ..., 54-n).

In each of the memory blocks 12-1, ..., 12-n exist a column of two rows 13a, 13b of CAM cells (hereinafter simply called the rows of memory cells) as one set, each including a predetermined number of CAM cells (bits) 11 vertically arranged, and a column of a predetermined number of sets (wards). In this case, the CAM cell 11 is used for storing 1-bit data.

The present invention is primarily featured in that a memory ward 13 including the CAM cell 11 for storing bits (e.g., 4, 8, 16, 32 bits etc.,) equivalent to one ward is formed with a column of two rows 13a, 13b of memory cells as one set, each including the CAM cells 11 for storing bits equivalent to ½ ward.

Therefore, the area occupied by feed lines 55-1, 55-2, ..., 55-m for outputting the results of match/mismatch due to retrieval of each memory ward 13 to the main priority encoder 53 can be reduced to ½ or less as in the case where the area of the main ward lines in each SRAM cell in the preceding embodiments has been reduced to ½ or less.

Although different kinds of memory cells are used in the SRAM 40 shown in FIG. 1 and the CAM 10 shown in FIG. 6, there is an obvious similarity between them in that two rows of memory cells storing bits of ½ ward are used to form one memory ward of one memory block. As the SRAM and the CAM are exactly similar to each other in that they equally have the address decoder 44 which is rendered hierarchical to include the main decoder 45 and the subdecoder 46, and the ward line which is also rendered hierarchical to include the main ward line 47 and the subward lines 24a, 24b, the description of a similar arrangement in the latter will be omitted.

Each of the feed lines 55-1, 55-2, ..., 55-m is extended horizontally from similar memory wards 13-1, 13-2, ..., 13-m of all the memory blocks 12-1, ..., 12-n to the main priority encoder 53 in such a manner as to straddle over all the memory blocks 12-1, ..., 12-n. Moreover, a signal of retrieval resulting from all the memory wards 13-1, ..., 13-m is supplied from any given memory block 12 to the main priority encoder 53 at the same time.

The rows 13a, 13b of memory cells constituting the memory ward 13 of each memory block 12 are each provided with match lines 14a, 14b to which flag data resulting from match retrieval indicative of whether the data stored in the CAM cell 1 storing predetermined bits matches the retrieval data fed from the outside. The match lines 14a, 14b are connected together and connected to a hit flag register 56 (56-1, ..., 56-m) provided in each memory ward 13 and further used to hold flag data resulting from match retrieval in each of the memory wards 13-1, ..., 13-m. Each of the hit flag registers 56-1, 56-2, ..., 56-m provided in all the memory wards 13-1, 13-2, ..., 13-m is connected via a tri-state buffer 57 to the feed line 55-1 (55-2, ..., 55-m) on a memory ward 13-1, ..., 13-m basis.

Each of the hit block selection lines (hereinafter called the enable line(s)) 58-1, ..., 58-n vertically extending from the subencoders 54-1, ..., 54-n is connected to the control terminals of all the tri-state buffers 57 in each of the memory wards 13-1, 13-2, ..., 13-m of the memory blocks 12-1, ..., 12-n. The flag data of the flag registers 56-1, 56-2, ..., 56-m of all the memory wards 13-1, 13-2, ..., 13-m of the memory block selected by the subencoder 54 is supplied to each of the feed lines 55-1, 55-2, ..., 55-m and simultaneously to the main priority encoder 53.

When there exists a hit signal, for example, "1" among the flag data held by all the flag registers 56-1, 56-2, ..., 56-m of each of the memory blocks 12-1, ..., 12-n, hit signal lines 59-1, ..., 59-n for supplying the hit signal, for example, "1" to the respective subencoders (registers) 54-1, ..., 54-n of the subencoder 54 intended for the respective memory blocks 12-1, . . . , 12-n are connected from the flag registers 56-1, 56-2, . . . , 56-m to the subencoder 54 on a memory block 12-1, . . . , 12-n basis.

In the CAM 10 thus configured, the hit signal is generated in the match lines 14a, 14b of the memory ward 12 where data matches with the retrieval data fed from the outside is stored. The hit signal generated in each of the memory wards 13-1, 13-2, . . . , 13-m is held in the corresponding flag register 56-1 (56-2, . . . , 56-m) and input to the subencoder 54 on a memory block 12-1, . . . , 12-n basis. In the subencoder 54, an active enable signal is supplied via the enable line 58-1 (58-2, . . . , 58-n) to only the memory block given the highest priority according to the order of priority from among the memory blocks 12-1, . . . , 12-n where the hit signal has been generated.

In the memory block supplied with the active enable signal, the tri-state gate 57 provided between the flag register 56-1 (56-2, . . . , 56-m) connected to the match lines 14a, 14b and the corresponding feed line 55-1 (55-2, . . . , 55-m) is turned on, and the hit signal generated in each memory ward 13 is supplied via the feed line 55-1 (55-2, . . . , 55-m) to the main priority encoder 53. In the main priority encoder 53, an address corresponding to the memory ward given the highest priority according to the order of priority from among the memory blocks where the hit signal has been generated is then encoded. Further, the address of the hit block is also encoded by the subencoder 54. By feeding retrieval data from outside the CAM 10, the address of the memory ward where what matches the data is stored can be encoded and output.

Figure 7:
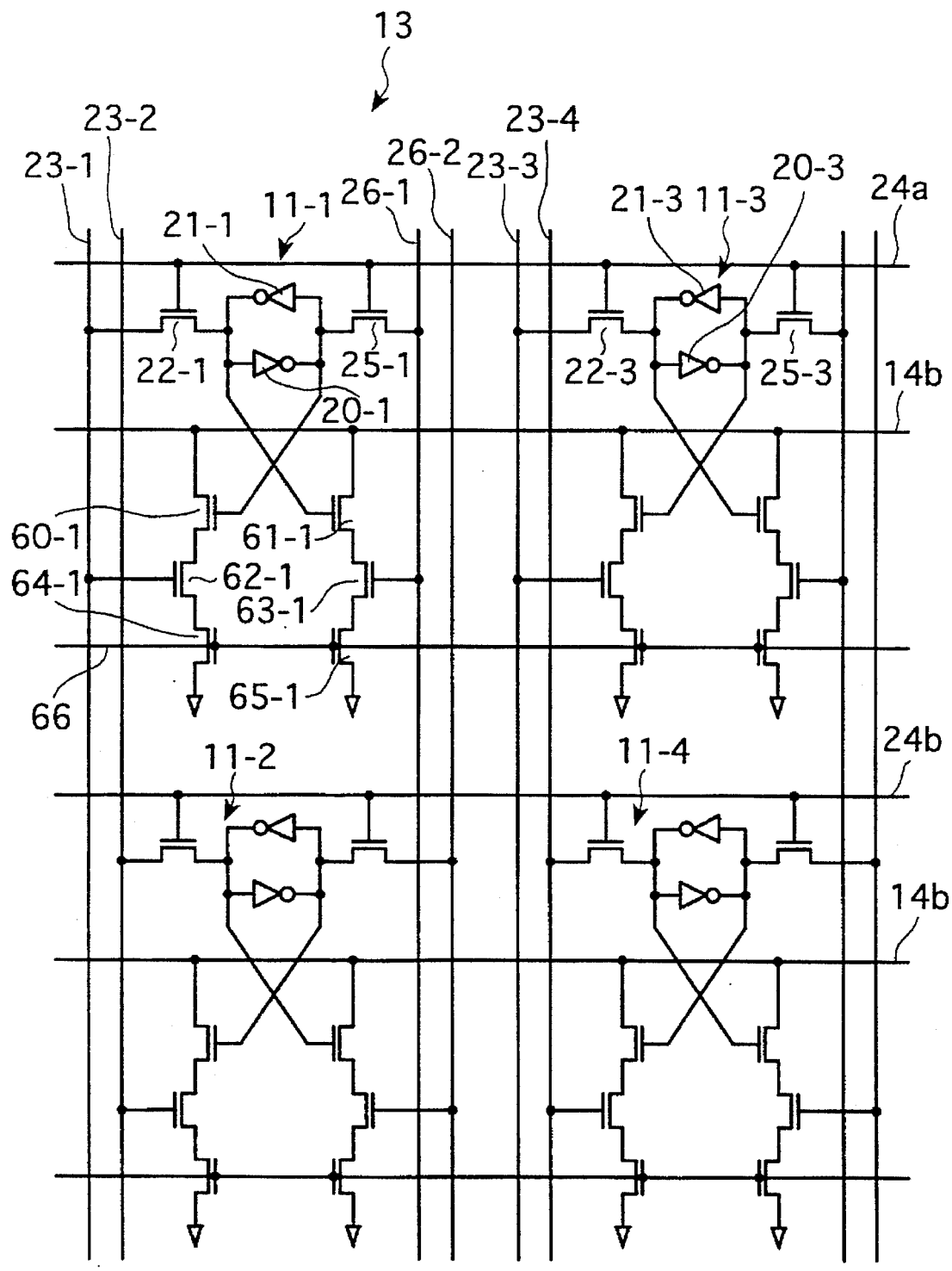
FIG. 7 is a block circuit diagram showing an arrangement of CAM cells of a memory ward employed for memory layout according to the present invention.

FIG. 7 shows rows of memory cells constituting a memory ward of CAM embodying the present invention. FIG. 7 is a block circuit diagram showing four CAM cells 11-1, 11-2, 11-3, 11-4 with a typical arrangement of a column of two rows 13a, 13b memory cells as a set. A memory ward 13 of FIG. 7 is exactly similar to the memory ward 168 of FIG. 13 except for the use of SRAM cells or CAM cells and only an arrangement of the retrieval unit of CAM cells. Further, the arrangement of CAM cells of the memory ward shown in FIG. 7 is similar to that of CAM cells of the memory ward shown in FIG. 13 excluding part of the arrangement thereof; consequently, like reference characters designate like and corresponding component elements of the latter with omission of the detailed description of the constitution and function of the former and only points of different will subsequently be described.

Figure 13:
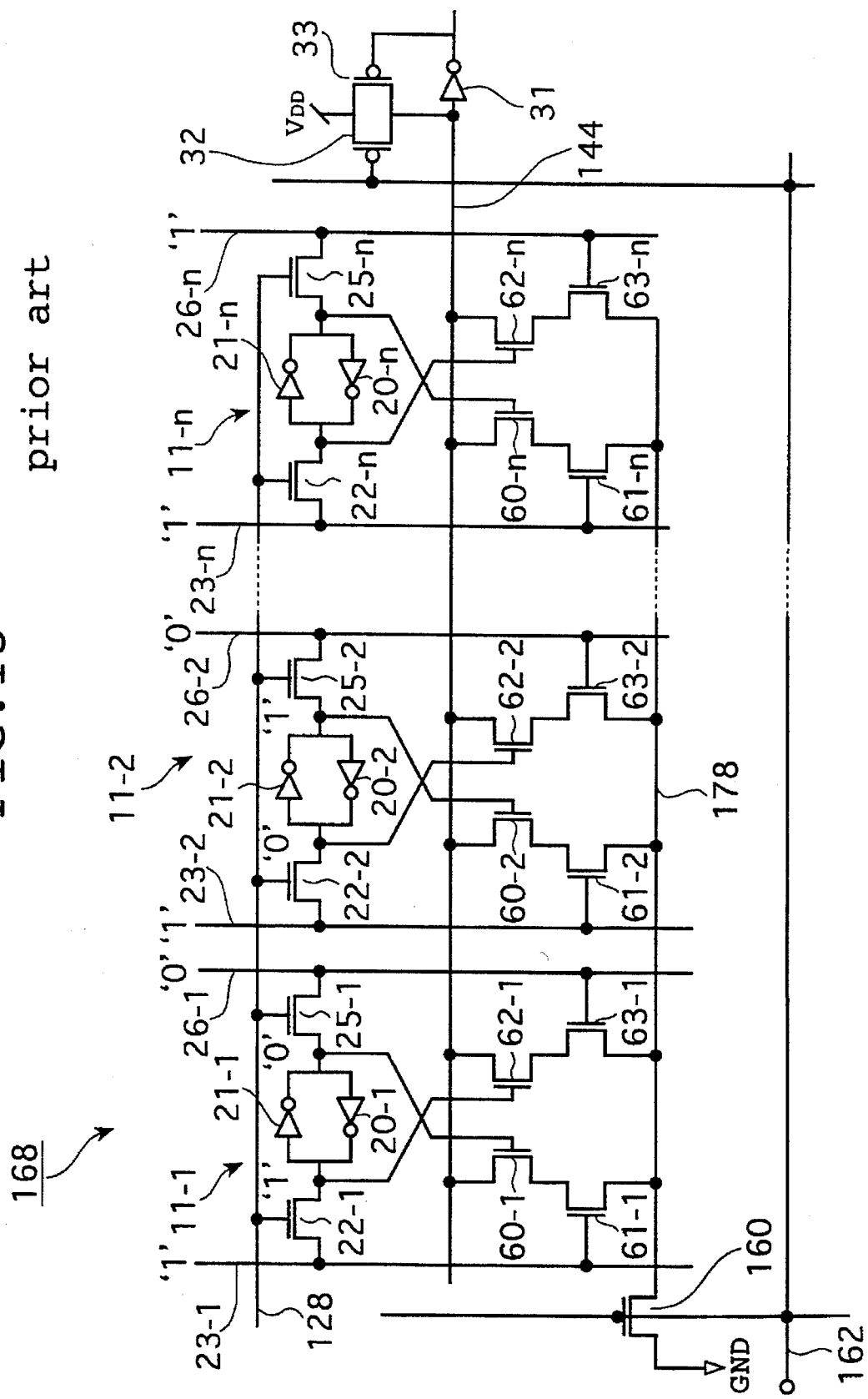
FIG. 13 is a block circuit diagram showing an arrangement of CAM cells of a conventional memory ward.

As shown in FIG. 7, there are two columns of CAM cells 11-1, 11-2, 11-3, 11-4. An arrangement of pairs of bit lines 23-1, 26-1 - 23-4, 26-4 is similar to what is shown in FIG. 13. In this case, the CAM cells 11-1, 11-2 form a column of memory cells 13a, whereas the CAM cells 11-3, 11-4 form another column of memory cells 13b.

A description will subsequently be given of the CAM cell 11-1 of FIG. 7 by way of example. In the retrieval unit of the CAM cell 11-1, four NMOS 60-1, 62-1 and 61-1, 63-1 constituting an exclusive OR (ExOR) circuit are connected in series to form two sets of columns of transistors, which are connected to the match line 14a in parallel. Further, these two sets of columns of transistors are grounded via NMOS 64-1, 65-1 connected in series, respectively. The gates of these NMOS 64-1, 65-1 are controlled by a control line 66 in the formed of a polysilicon layer in terms of write/read of the CAM cell 11-1 and the timing of match retrieval.

In the case of the arrangement of the CAM cells of the memory ward 13 shown in FIG. 7, the match line 144 is divided into the two match lines 14a, 14b in contrast with the arrangement of memory cells of the memory ward 168; therefore, the whole length thereof is the same. While metal wiring is normally employed, the length of each of the match lines 14a, 14b is halved, whereby not only the signal transmission speed of the match lines 14a, 14b but also the match retrieval operation becomes improvable.

What is important further is that since the CAM cells 11 have conventionally been arranged horizontally to form one ward of CAM, an identity detection circuit for detecting the result of retrieval, the feed line 55 for supplying the result to the main encoder 53 and so forth have to be arranged at the same level as that of the CAM cell 11. This requires for a coincident circuit and a logical circuit such as a flag register to be organized as dense as memory cells, which has been considerably difficult to comply with.

Notwithstanding, the two columns of CAM cells 11 as shown in FIG. 13 facilitate the arrangement of logical circuits and simultaneously make it possible to halve the area occupied by the feed lines 55 with respect to the CAM cells.

Needless to say, the aforementioned advantage is increased further by providing n-columns of CAM cells 11. If, however, n is increased too much, the number of bit lines in pair will also increase and this may result in making the arrangement of sense amplifiers (not shown) difficult. Therefore, approximately n=2 is preferred.

Figure 8:
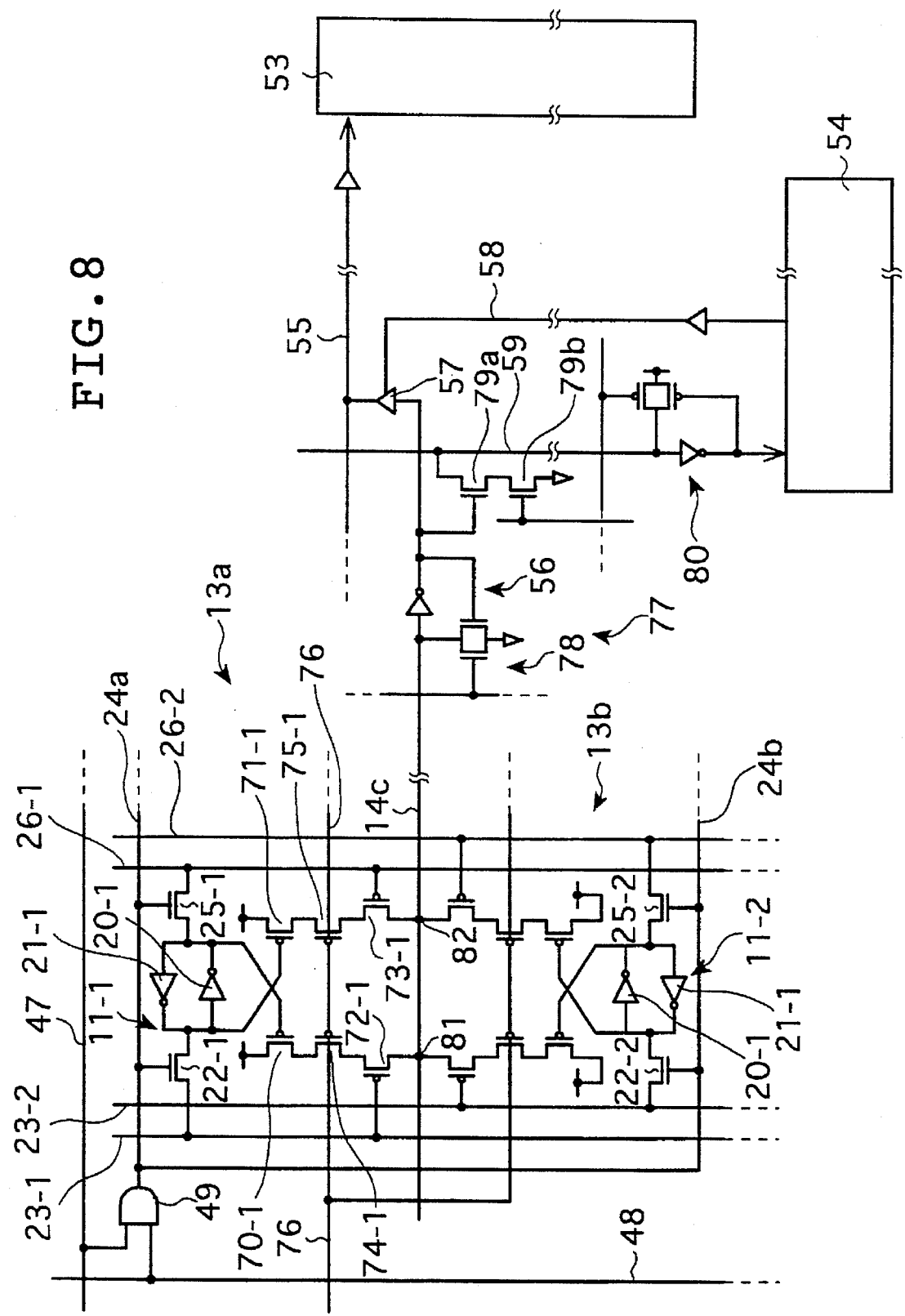
FIG. 8 is a block circuit diagram showing another arrangement of CAM cells of a memory ward employed for memory layout according to the present invention.

The layout of memory wards using OR-type CAM cells may also be adopted as shown in FIG. 8. The CAM cells shown in FIG. 8 are so arranged that the six NMOS 60-1, 61-1, 62-1, 63-1, 64-1, 65-1 in the retrieval unit of the CAM cell 11-1, for example, are totally replaced with PMOS 70-1, 71-1, 72-1, 73-1, 74-1, 75-1 to form an exclusive NOR (ExNOR) circuit. Further, a memory ward with an match line 14c for common use is formed by inverting one of the two CAM cells. Although the read/write operation with respect to the CAM cell is similar in both cases above, the difference lies in the fact that the CAM cell of FIG. 7 precharges the match line 14, whereas the CAM cell of FIG. 8 discharges the match line, and that though the potentials of the former and latter match lines remain unchanged in the case of equality, the charge precharged in the match line of the CAM cell of FIG. 7 is discharged from the match line, whereas the discharged match line of the CAM cell of FIG. 8 is charged in the case of inequality.

In the memory ward 13 of FIG. 8, moreover, a sense amplifier 77 different from a sense amplifier 33 of FIG. 13 is connected to the end of the common match line 14c. The sense amplifier 77 has a discharge transistor 78, which functions as the flag register 56 capable of holding the result of match retrieval. Moreover, means for supplying the hit signal held in the sense amplifier 77 to the subencoder includes an NMOS 79a with a control transistor 79b whose gate is connected to the output of the match line 14c and whose drain is connected to the hit signal line 59, and a sense amplifier 80 having precharge and latch functions. In the case of equality, the match line 14c maintains the discharged low level and an inverted signal "1" (H) is held by the flag register 56, whereby the NMOS 79a is turned on so as to pull out the precharged charge of the hit signal line 59. Thus the output of the sense amplifier is set to "1" and a hit signal (a coincident signal) "1" is applied to the subencoder 54, so that the presence of a hit memory ward in the memory block is indicated. Since the match line 14c is conversely charged in the case of inequality and set to the high level, an inverted signal "0" (H) is held by the flag register 56 and the NMOS 79a is turned off to supply the subencoder 54 with an inequality signal "0", so that the presence of an inequality memory ward in the memory block is indicated.

In the layout of the CAM thus configured according to the present invention, two or more columns, instead of conventional one column of memory cells can be arranged in the memory ward configuration of FIG. 7 or 8. Consequently, the length of not only the main ward line 47 but also the feed line 55 shown in FIG. 6 can be reduced to ½ or less, to say nothing of making it possible to reduce the length of each of the subward lines 24a, 24b, 24c and match lines 14a, 14b, 14c to ½ or less, together with increasing the operating speed of the circuit and signal transmission speed. Since the length of the main ward line 47 and the feed line 55 for which metal wiring is used can also be reduced to ½ or less, moreover, the metal wiring space required therefor per memory ward can be reduced to ½ or less likewise. Increased memory integration thus becomes feasible.

In the layout of the content-addressable memory according to the present invention, the two adjoining columns of content-addressable memory cells may be adapted for common use by arranging the content-addressable memory cells on both sides of the match line which is held therebetween as shown in FIG. 8. In this case, the length of the match line can be halved and the precharged charge is discharged quickly into the match line to that extent or otherwise the match line that has been discharged is quickly precharged, so that the retrieval operation speed is improved. According to the present invention, further, the connections 81, 82 between the retrieval units of both the content-addressable memory cells and the match line held therebetween and adapted for common use as shown in FIG. 8 may be made common to the content-addressable memories on both sides. Since the two connections (81, 82) or one connection (not shown) with respect to the two content-addressable memory cells can be adapted for common use as shown in FIG. 8, not only the number of electrical connections (contacts, etc.) due to connection holes forming such connections but also the junction capacitance is reducible. Further, the retrieval operation speed can be increased, whereas power consumption can be lowered.

Although a description has been given of the OR type CAM cells (NOR type CAM cell) as content-addressable memory cells by way of example, the present invention is not limited to these embodiments as set forth above but applicable to AND type CAM cells (including NAND type CAM cell).

Even in the cases of the second and third content-addressable memories according to the present invention, the plurality of memory blocks may be grouped into one block as in the SRAM 90 shown in FIG. 5, for example, so as to configure CAM with the plurality of memory block groups. In this case, though not shown, main encoders and subencoders in each memory block group are connected to a group selection circuit of the CAM block so as to select any one of the groups via a selection line connected thereto. Therefore, one feed line, like the main ward line, is passed through not all the memory blocks but the plurality of memory blocks thus grouped.

As set forth above in detail, the signal transmission speed and the circuit operating speed or the match retrieval speed are made improvable since not only the signal transmission length of the subward line and/or the match line or the wiring length but also the wiring length of the main ward line and/or the feed line can be reduced to approximately ½ or less. In addition, the space required for metal wiring including the main ward line and the feed lines can also be reduced to approximately ½ or less. Increased memory integration thus becomes feasible.

Moreover, the influence of the coupling effect resulting from the adjoining bit lines is reducible in the case where the pair of bit lines are made to cross each other. In the content-addressable memory in which the match line is adapted for common use according to the present invention, the number of connections is also reducible in the case where the connection with the match line subjected to metal wiring is adapted for common use. The junction capacitance can thus be reduced with effect of making it feasible to increase the retrieval operation speed and to reduce power consumption.

What is claimed is:

1. A layout of a semiconductor memory on a semiconductor chip, the semiconductor memory comprising:

a plurality of memory blocks, each block including a plurality of memory wards, each ward including a plurality of memory cells for storing 1-bit data, a main ward line extending from a main decoder for selecting one of the plurality of memory wards through each of the plurality of memory wards of the plurality of memory blocks in a first predetermined direction, a memory block selection line extending from a subdecoder for selecting one of the plurality of memory blocks to the memory wards of each of the plurality of memory blocks in a second direction intersecting the first direction, and at least one memory ward selection means for receiving the main ward line and the memory block selection line in each memory ward of the memory block, wherein in each memory ward of the memory block, a column of more than one row of the plurality of memory cells are arranged in the first direction and wherein at least one subward line capable of simultaneously and totally activating the plurality of memory cells constituting the row of memory cells by means of the memory ward selection means is provided for a column of more than one row of memory cells of the same memory ward with respect to the one main ward line.

2. The layout of a semiconductor memory as claimed in claim 1, wherein the memory cell is accessed via the subward line extended in the first direction and a pair of bit lines each extending in the second direction and wherein in the two rows of memory cells out of a column of more than one row of memory cells constituting one memory ward, two adjoining pairs of bit lines as one set are arranged so that one of the two bit lines constituting the other pair of bit lines is placed between the two bit lines constituting one pair of bit lines and extended in the second direction.

3. The layout of a semiconductor memory as claimed in claim 2, wherein the two pairs of bit lines constituting each set are arranged so that the two bit lines constituting one of the two pairs of bit lines constituting each set repeatedly cross each other in different phases in the second direction.

4. The layout of a semiconductor memory as claimed in claim 1, wherein one subward line is provided for each row of memory cells of a column of more than one row of memory cells.

5. The layout of a semiconductor memory as claimed in claim 1, wherein one subward line is commonly used for the plurality of memory cells constituting the two rows of memory cells adjacent to each other in the second direction within a column of more than one row of memory cells and wherein the plurality of memory cells are arranged on both sides of the subward line for common use.

6. The layout of a semiconductor memory as claimed in claim 1, wherein the semiconductor memory is a static random access memory.

7. The layout of a semiconductor memory as claimed in claim 1, wherein the semiconductor memory is a content-addressable memory.

8. A layout of a content-addressable memory on a semiconductor chip, the content-addressable memory comprising:

a plurality of content-addressable memory blocks, each content-addressable memory block including a plurality of content-addressable memory wards, each content addressable memory ward including a plurality of content-addressable memory cells for storing 1-bit data, a feed line extending from the plurality of content-addressable memory blocks in a predetermined first direction with respect to each of the plurality of content-addressable memory wards to a main priority encoder for encoding flag data obtained as a result of carrying out a match retrieval by matching retrieval data supplied to the plurality of content-addressable memory wards of the content-addressable memory block with stored data as a collection of 1-bit data stored in each of the plurality of content-addressable memory wards according to a predetermined order of priority, a hit block selection line extending from a subpriority encoder for giving priority order to the plurality of content-addressable memory blocks through the whole content-addressable memory wards in a second direction intersecting the first direction with respect to each of the plurality of content-addressable memory blocks, and flag data input means for supplying flag data resulting from the match retrieval in the plurality of content-addressable memory wards via each corresponding feed line to the main priority encoder, the flag data input means being provided in each of the plurality of content-addressable memory wards of the content-addressable memory block selected by the hit block selection line, wherein in each content-addressable memory ward of the content-addressable memory block, a column of more than one row of the plurality of content-addressable memory cells are arranged in the first direction, wherein the same flag data input means is connectable to more than one row of content-addressable memory cells of the same content-addressable memory ward, and wherein at least one match line for receiving a hit signal indicative of whether the retrieval data is stored in the content-addressable memory ward at the time of the match retrieval is provided for the one feed line.

9. The layout of a content-addressable memory as claimed in claim 8 further comprising:

a main ward line extending from a main decoder for selecting one of the plurality of content-addressable memory wards through each of the plurality of content-addressable memory wards of the plurality of content-addressable memory blocks in a first predetermined direction, a memory block selection line extending from a subdecoder for selecting one of the plurality of content-addressable memory blocks to the content-addressable memory wards of each of the plurality of content-addressable memory blocks in a second direction intersecting the first direction, and at least one memory ward selection means for receiving the main ward line and the memory block selection line, the memory ward selection means being provided in each content-addressable memory ward of the content-addressable memory block, wherein at least one subward line capable of simultaneously and totally activating the plurality of content-addressable memory cells constituting the row of memory cells by means of the memory ward selection means is provided for a column of more than one row of content-addressable memory cells of the same content-addressable memory ward with respect to the one main ward line.

10. The layout of a content-addressable memory as claimed in claim 8, wherein the content-addressable memory cell is accessed via the subward line extended in the first direction and a pair of bit lines each extending in the second direction and wherein in the two rows of content-addressable memory cells out of a column of more than one row of memory cells constituting one content-addressable memory ward, two adjoining pairs of bit lines as one set are arranged so that one of the two bit lines constituting the other pair of bit lines is placed between the two bit lines constituting one pair of bit lines and extended in the second direction.

11. The layout of a content-addressable memory as claimed in claim 10, wherein the two pairs of bit lines constituting each set are arranged so that the two bit lines constituting one of the two pairs of bit lines constituting each set repeatedly cross each other in different phases in the second direction.

12. The layout of a content-addressable memory as claimed in claim 8, wherein one match line is commonly used for the plurality of content-addressable memory cells constituting the two rows of content-addressable memory cells adjacent to each other in the second direction within a column of more than one row of content-addressable memory cells and wherein the plurality of content-addressable memory cells are arranged on both sides of the match line for common use.

13. The layout of a content-addressable memory as claimed in claim 12, wherein the connection between a retrieval unit of the content-addressable memory cell and the match line is commonly used with two content-addressable memory cells arranged on both sides of the match line for common use.

* * * * *